US012641756B2

(12) United States Patent
Li et al.

(10) Patent No.: US 12,641,756 B2
(45) Date of Patent: May 26, 2026

(54) DATA-ANALYSIS-BASED ENERGY-SAVING CONTROL METHOD FOR PRECISION AIR CONDITIONER IN CLOUD COMPUTING DATA CENTER

(71) Applicant: SHANGHAI YOVOLE NETWORKS INC., Shanghai (CN)

(72) Inventors: Jiwen Li, Shanghai (CN); Xin Lyu, Shanghai (CN); Ke An, Shanghai (CN); Rong Xu, Shanghai (CN)

(73) Assignee: SHANGHAI YOVOLE NETWORKS INC., Shanghai (CN)

( * ) Notice: Subject to any disclaimer, the term of this patent is extended or adjusted under 35 U.S.C. 154(b) by 673 days.

(21) Appl. No.: 18/016,454

(22) PCT Filed: Jul. 13, 2021

(86) PCT No.: PCT/CN2021/106050
§ 371 (c)(1),
(2) Date: Jul. 9, 2023

(87) PCT Pub. No.: WO2022/012542
PCT Pub. Date: Jan. 20, 2022

(65) Prior Publication Data
US 2023/0371213 A1     Nov. 16, 2023

(30) Foreign Application Priority Data

Jul. 15, 2020    (CN) .......................... 202010677684.4

(51) Int. Cl.
*H05K 7/20*          (2006.01)
*G06N 7/01*          (2023.01)
(52) U.S. Cl.
CPC ........... *H05K 7/20836* (2013.01); *G06N 7/01* (2023.01); *H05K 7/20745* (2013.01)

(58) Field of Classification Search
CPC .. G06N 20/00; G06N 7/01; G06N 5/01; F24F 11/64; F24F 11/46; F24F 11/38; F24F 11/63; F24F 11/30
See application file for complete search history.

(56) References Cited

U.S. PATENT DOCUMENTS

| | | | |
|---|---|---|---|
| 6,725,208 B1 * | 4/2004 | Hartman | .............. G05B 13/027 |
| | | | 706/23 |
| 7,020,642 B2 * | 3/2006 | Ferguson | ............ G06F 18/2433 |
| | | | 700/53 |

(Continued)

FOREIGN PATENT DOCUMENTS

| | | |
|---|---|---|
| CN | 104134100 A | 11/2014 |
| CN | 109798646 A | 5/2019 |

(Continued)

*Primary Examiner* — Darrin D Dunn

(74) *Attorney, Agent, or Firm* — Bayramoglu Law Offices LLC

(57) ABSTRACT

A data analysis-based energy-saving control method for a precision air conditioner in a cloud computing data center, a medium, and a system, initially trains a Bayesian linear regression model based on historical datasets of heat source data of a cloud server and control quantity data of a precision air conditioner, and is used to predict a temperature difference between temperature sensors in a data center in future time, obtain newly-added training data in real time in a control process, update the Bayesian linear regression model in real time, predict the temperature difference between the sensors in real time, and obtain an optimal control quantity of a combination of a frequency of a discrete compressor and an opening degree of a water valve in real time by using a grid search algorithm to control an actual temperature difference between the sensors in the future.

12 Claims, 4 Drawing Sheets

(56)                    References Cited

U.S. PATENT DOCUMENTS

| 7,565,334 | B2 * | 7/2009 | Rifkin | .................... G06N 7/01 |
| | | | | 706/12 |
| 10,274,382 | B1 | 4/2019 | Trundle | |
| 10,817,757 | B2 * | 10/2020 | Sainani | ................ G06N 5/025 |
| 2018/0195752 | A1 * | 7/2018 | Sasaki | .................... F24F 11/64 |

FOREIGN PATENT DOCUMENTS

| CN | 109871987 A | 6/2019 |
| CN | 110392515 A | 10/2019 |
| CN | 111561772 A | 8/2020 |
| CN | 112393390 A | 2/2021 |

* cited by examiner

DATA-ANALYSIS-BASED ENERGY-SAVING CONTROL METHOD FOR PRECISION AIR CONDITIONER IN CLOUD COMPUTING DATA CENTER

CROSS-REFERENCES TO THE RELATED APPLICATIONS

The application is a national stage entry of PCT/CN2021/106050 filed on Jul. 13, 2021, which claims priority to Chinese patent application No. 202010677684.4 filed on Jul. 15, 2020, the entire content of which is incorporated herein by reference.

TECHNICAL FIELD

The present disclosure relates to the field of cold source design in a data center, and specifically, to a data analysis-based energy-saving control method for a precision air conditioner in a cloud computing data center, a medium, and a system.

BACKGROUND

With the continuous development of the information industry and social economy, the construction scale and quantity of data centers are growing rapidly. The heat dissipating capacity of the data center is also rising rapidly. In order to ensure the normal operation of the data center, it is necessary to turn on a precision air conditioning system throughout the year to discharge heat generated by the data center in a machine room.

With intensifying competition between the data centers and an increase in operation costs, it is urgent to realize the energy saving of a precision air conditioner cooling system. At present, the precision air conditioner cooling system mostly performs refrigeration by using a thermodynamic prediction method, but the thermodynamic prediction method is not suitable for a real-time dynamic temperature prediction due to complex calculations and a slow-solving process.

Therefore, it is necessary to design a fast temperature prediction algorithm by considering the real-time performance of a temperature prediction to calculate an optimal control quantity of a precision air conditioner in real-time, thereby improving the energy-saving performance of the precision air conditioner cooling system and ultimately improving the overall efficiency of the whole system.

SUMMARY

To overcome the drawbacks in the prior art, the present disclosure is intended to provide a data analysis-based energy-saving control method for a precision air conditioner in a cloud computing data center, a medium, and a system.

A data analysis-based energy-saving control method for a precision air conditioner in a cloud computing data center provided according to the present disclosure includes following steps:

step S1: constructing an initial training dataset by using historical sampling data, defining a time interval between each two adjacent sampling time points as a sampling cycle, and defining a prediction cycle for each sampling cycle, where a length of the prediction cycle is a prediction depth of a temperature difference prediction model, and an initial time point of the prediction cycle is an initial time point of a same sampling cycle;

the initial training dataset is constructed by taking heat source data of a cloud server and control quantity data of a water-cooled precision air conditioner at the initial time point of the prediction cycle as input data of the model, and taking a measured sensor temperature difference at an end time point of the same prediction cycle as output data of the model; the heat source data includes performance data and temperature data of a component of the cloud server, the control quantity data includes an opening degree of an electric water valve and an air conditioning frequency, and a sensor temperature difference is a difference between a temperature at a return air position of the water-cooled precision air conditioner and a temperature at an air outlet position of the water-cooled precision air conditioner; and the measured sensor temperature difference is a difference between a temperature measured at the return air position of the water-cooled precision air conditioner and a temperature measured at the air outlet position of the water-cooled precision air conditioner;

step S2: pre-processing the initial training dataset;

step S3: initially training a Bayesian linear regression model based on pre-processed initial training data to obtain an initial temperature difference prediction model;

step S4: obtaining a newly-added training dataset, where the newly-added training dataset includes: heat source data of the cloud server at an initial time point of a prediction cycle predicted at the end of an initial time point of a current sampling cycle, control quantity data of the water-cooled precision air conditioner at the initial time point of the prediction cycle predicted at the end of the initial time point of the current sampling cycle, and a measured sensor temperature difference of a machine room at an end time point of the prediction cycle predicted at the end of the initial time point of the current sampling cycle;

step S5: pre-processing the newly-added training dataset;

step S6: incrementally training the Bayesian linear regression model online based on a pre-processed newly-added training dataset;

step S7: based on a current Bayesian linear regression model, by predicting a sensor temperature difference at an end time point of a prediction cycle defined for the current sampling cycle, finding an optimal combination of the opening degree of the electric water valve and the air conditioning frequency, and using and implementing the optimal combination, where the process specifically includes: traversing predicted sensor temperature differences at the end time point of the prediction cycle defined for the current sampling cycle that are obtained by taking heat source data and each element in a gear combination set at the initial time point of the current sampling cycle as inputs of the current Bayesian linear regression model, and resetting the opening degree of the electric water valve and the air conditioning frequency in the current sampling cycle for the water-cooled precision air conditioner based on an element corresponding to a predicted sensor temperature difference less than and approximate to a target temperature difference threshold, where the gear combination set is a complete set of combinations obtained by pairing opening degrees of the electric water valve under different gears and air conditioning frequencies under the different gears; and step S8: determining whether the process is over; and if the process is over, terminating the process; or if the process is not over, performing the step S4 continuously for a next sampling cycle of the current sampling cycle.

Preferably, the performance data in the step S1 and the step S4 includes any one or more kinds of following data:

a fan speed of each cloud server node in the machine room;

a frequency of a central processing unit (CPU) of each cloud server node in the machine room; and memory usage of each cloud server node in the machine room; and the temperature data includes any one or more kinds of following data:

an inlet air temperature of each cloud server node in the machine room;

an outlet air temperature of each cloud server node in the machine room;

a temperature of the CPU of each cloud server node in the machine room; and a temperature of a graphics processing unit (GPU) of each cloud server node in the machine room.

Preferably, the step S2 and the step S5 include following steps:

a data cleaning step: if an obtained value $$x_t''$$

of a sampling data item at a sampling time point t is a vacant value, filling the vacant value with a historical average value of the data item;

a normalization step: for each data item, denoting minimum and maximum values of the data item in the initial training dataset defined in the step S1 as $x_{min}$ and $x_{max}$ respectively, and mapping an original value $$x_t''$$

of the data item onto a new value $$x_t'$$

that is approximately in an interval [0,1], where a corresponding formula is:

$$x_t' = \frac{(x_t'' - x_{min})}{(x_{max} - x_{min})};$$

and a weight adjustment step: setting a relatively early training sample to have a low contribution to the Bayesian linear regression model, where a linear function corresponding to a contribution weight is:

$$w(t) = \alpha(t - t_0)$$

where w(t) represents a time-related contribution weight, $\alpha$ represents a parameter for adjusting a rate at which the contribution weight w(t) increases with time, t represents a current sampling time point, $t_0$ represents a historical first sampling time point, and $\alpha \in (0, +\infty)$;

changing the value $$x_t'$$

of the data item to a new value $x_t$ through weight adjustment, where a corresponding formula is:

$$x_t = w(t)x_t'; \text{ and}$$

combining a processed value $x_t$ of each data item in the training sample into a pre-processed training sample as an input for initially training the Bayesian linear regression model in the step S3 and incrementally training the Bayesian linear regression model in the step S6.

Preferably, the step S3 includes:

an initial learning step: in an initial training stage of the Bayesian linear regression model, setting a prior distribution of a model parameter to obey a Gaussian-anti-GAMMA probability distribution with given initial hyper-parameters being $\mu_0$, $\Lambda_0$, $a_0$, and $b_0$, and after the initial training is completed for the Bayesian linear regression model, setting a posteriori distribution of the model parameter to obey a Gaussian-anti-GAMMA probability distribution with hyper-parameters being $\mu_0$, $\Lambda_0$, $a_n$, and $b_n$, where n represents a last sampling cycle in the initial training dataset; and all the hyper-parameters $\mu_n$, $\Lambda_n$, $a_n$, and $b_n$ are simple functions of $\mu_0$, $\Lambda_0$, $a_0$, $b_0$, and an initial training sample set, and have analytical solutions; and the step S6 includes:

an incremental learning step: in an incremental training stage of the Bayesian linear regression model, setting a model parameter before a current sampling cycle t to obey a Gaussian-anti-GAMMA probability distribution with hyper-parameters being $\mu_{t-1}$, $\Lambda t_{t-1}$, $a_{t-1}$, and $b_{t-1}$, and adding a sampling training sample for the current sampling cycle t in the current sampling cycle t to update a model parameter in the current sampling cycle t to obey a Gaussian-anti-GAMMA probability distribution with hyper-parameters being $\mu_t$, $\Lambda_t$, $a_t$, and $b_t$, where all the hyper-parameters $\mu_t$, $\Lambda_t$, $a_t$, and $b_t$ are simple functions of $\mu_{t-1}$, $\Lambda_{t-1}$, $a_{t-1}$, $b_{t-1}$, and an incremental training sample, and have analytical solutions.

Preferably, initial time points of two consecutive adjacent prediction cycles are initial time points of two consecutive adjacent sampling cycles.

A computer-readable storage medium storing a computer program is provided according to the present disclosure, where the computer program is executed by a processor to implement steps of the data analysis-based energy-saving control method for a precision air conditioner in a cloud computing data center.

A data analysis-based refrigeration system for a cloud computing data center provided according to the present disclosure includes:

a machine room unit 200 provided with a cloud server; and a refrigeration region 300 disposed on one side of the machine room unit 200, where the refrigeration region 300 is connected to the machine room unit 200 through an air supply channel 329, cold air generated by the refrigeration region 300 enters the machine room unit 200 through the air supply channel 329, and the refrigeration region 300 is provided with a water-cooled precision air conditioner refrigeration unit, where the water-cooled precision air conditioner refrigeration unit includes:

a water-cooled precision air conditioner 320 configured to cool air from the machine room unit 200;

an electric water valve 322 disposed on a chilled water return pipe 323 of the water-cooled precision air conditioner 320;

a first sensor 311 disposed in the refrigeration region 300 and located at a return air position of the water-cooled precision air conditioner 320, where the first sensor 311 is electrically connected to a control unit 400, the first sensor 311 is configured to collect a temperature of hot air entering the water-cooled precision air conditioner 320 and send the collected temperature to the control unit 400, and the control unit 400 defines the temperature sent by the first sensor 311 as a temperature at the return air position; and a second sensor 312 disposed within the air supply channel 329 and located at a bottom of the water-cooled precision air conditioner 320, where the second sensor 312 is electrically connected to the control unit 400, the second sensor 312 is configured to collect a temperature of cold air output by the water-cooled precision air conditioner 320 and send the collected temperature to the control unit 400, and the control unit 400 defines the temperature sent by the second sensor 312 as a temperature at an air outlet position; and the data analysis-based refrigeration system for a cloud computing data center further includes:

the control unit 400 including the computer-readable storage medium storing the computer program according to claim 6, to control an opening degree of the electric water valve of the water-cooled precision air conditioner 320 and an air conditioning frequency of the water-cooled precision air conditioner 320.

Preferably, in the control unit 400, a program module in the computer-readable storage medium storing the computer program includes:

a data collection module 410 configured to collect heat source data of the cloud server, control quantity data of the water-cooled precision air conditioner, and a measured sensor temperature difference;

a data pre-processing module 420 configured to pre-process the data collected by the data collection module 410;

a temperature difference prediction model training module 430 configured to train a Bayesian linear regression model based on pre-processed data; and an optimal solution search module 440 configured to find an optimal combination of the opening degree of the electric water valve and the air conditioning frequency based on the Bayesian linear regression model, and use and implement the optimal combination.

Preferably, in the control unit 400, the data collection module 410 includes:

an initial training dataset construction module 411 configured to construct an initial training dataset by using historical sampling data, define a time interval between each two adjacent sampling time points as a sampling cycle, and define a prediction cycle for each sampling cycle, where a length of the prediction cycle is a prediction depth of a temperature difference prediction model, and an initial time point of the prediction cycle is an initial time point of a same sampling cycle; the initial training dataset is constructed by taking heat source data of the cloud server and control quantity data of the water-cooled precision air conditioner at the initial time point of the prediction cycle as input data of the model, and taking a measured sensor temperature difference at an end time point of the same prediction cycle as output data of the model; the heat source data includes performance data and temperature data of a component of the cloud server, the control quantity data includes the opening degree of the electric water valve and the air conditioning frequency, and a sensor temperature difference is a difference between the temperature at the return air position of the water-cooled precision air conditioner and the temperature at the air outlet position of the water-cooled precision air conditioner; and the measured sensor temperature difference is a difference between a temperature measured at the return air position of the water-cooled precision air conditioner and a temperature measured at the air outlet position of the water-cooled precision air conditioner; and a newly-added training dataset construction module 412 configured to obtain a newly-added training dataset, where the newly-added training dataset includes: heat source data of the cloud server at an initial time point of a prediction cycle ending at an initial time point of a current sampling cycle, control quantity data of the water-cooled precision air conditioner at the initial time point of the prediction cycle ending at the initial time point of the current sampling cycle, and a measured sensor temperature difference of a machine room at an end time point of the prediction cycle ending at the initial time point of the current sampling cycle;

the data pre-processing module 420 includes:

an initial training dataset pre-processing module 421 configured to pre-process the initial training dataset; and a newly-added training dataset pre-processing module 422 configured to pre-process the newly-added training dataset;

the temperature difference prediction model training module 430 includes:

an initial training dataset training module 431 configured to initially train the Bayesian linear regression model based on pre-processed initial training data to obtain an initial temperature difference prediction model; and a newly-added training dataset training module 432 configured to incrementally train the Bayesian linear regression model online based on a pre-processed newly-added training dataset; and the optimal solution search module 440 includes:

a grid search module 441 configured to, based on a current Bayesian linear regression model, by predicting a sensor temperature difference at an end time point of a prediction cycle defined for the current sampling cycle, find the optimal combination of the opening degree of the electric water valve and the air conditioning frequency, and use and implement the optimal combination, where the process specifically includes: traversing predicted sensor temperature differences at the end time point of the prediction cycle defined for the current sampling cycle that are obtained by taking heat source data and each element in a gear combination set at the initial time point of the current sampling cycle as inputs of the current Bayesian linear regression model, and resetting the opening degree of the electric water valve and the air conditioning frequency in the current sampling cycle for the water-cooled precision air conditioner based on an element corresponding to a predicted sensor temperature difference less than and approximate to a target temperature difference threshold, where the gear combination set is a complete set of combinations obtained by pairing opening degrees of the electric water valve under different gears and air conditioning frequencies under the different gears; and a process termination determining module 442 configured to determine whether the process is over; and if the process is over, terminate the process; or if the process is not over, trigger the newly-added training dataset construction module 412 to continuously perform the corresponding operations for a next sampling cycle of the current sampling cycle.

Compared with the prior art, the present disclosure has following beneficial effects:

1. The present disclosure initially trains a Bayesian linear regression model based on historical datasets of heat source data of a cloud server and control quantity data of a precision air conditioner, and is used to predict a temperature difference between temperature sensors in a data center in future time, obtain newly-added training data in real time in a control process, update a Bayesian linear regression prediction model in real time, predict the temperature difference between the sensors in real time, and obtain an optimal control quantity of a combination of a frequency of a discrete compressor and an opening degree of a water valve in real time by using a grid search algorithm, so as to control an actual temperature difference between the sensors in the future to be less than a preset temperature difference threshold with a small energy consumption.

2. The present disclosure selects an effective ambient temperature to predict an input quantity, combines an online incremental learning prediction algorithm and a discrete grid search method, and quickly and efficiently calculates an optimal control quantity of a water-cooled precision air conditioner in the control process, namely, in a training process, and finally obtains a good energy-saving effect of the precision air conditioner.

3. The prediction model, control quantity traversal, and optimal control in the present disclosure are closely related, which work together to effectively improve real-time performance of energy-saving control.

BRIEF DESCRIPTION OF THE DRAWINGS

Other features, objectives, and advantages of the present disclosure will become more apparent by reading the detailed description of non-limiting embodiments with reference to the following accompanying drawings.

REFERENCE NUMERALS

Figure 1:
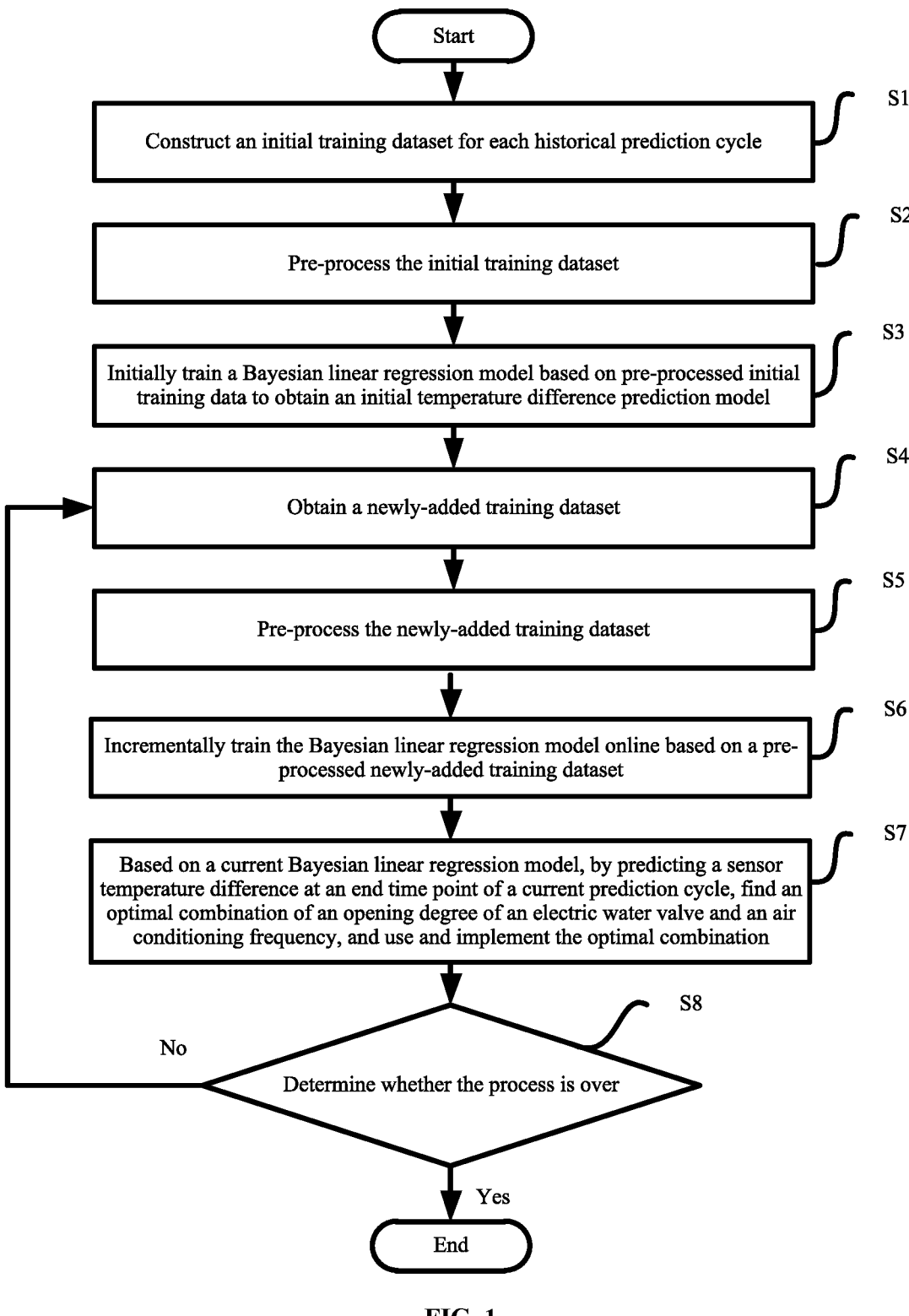
FIG. 1 is a flowchart of steps of a whole method according to the present disclosure.

Data center 100;
Machine room unit 200;
Server cabinet 201;
Wall body 202;
Refrigeration region 300;
First sensor 311;
Second sensor 312;
Water-cooled precision air conditioner 320;
Wind turbine 321;
Electric water valve 322;
Chilled water return pipe 323;
Chilled water supply pipe 324;
Chilled water circulating pump 325;
Helical-lobe compressor 326;
Cold storage tank 327;
Hot air channel 328;
Air supply channel 329;
Control unit 400;
Data collection module 410;
Initial training dataset construction module 411;
Newly-added training dataset construction module 412;
Data pre-processing module 420;
Initial training dataset pre-processing module 421;
Newly-added training dataset pre-processing module 422;
Temperature difference prediction model training module 430;
Initial training dataset training module 431;
Newly-added training dataset training module 432;
Optimal solution search module 440;
Grid search module 441;
Process termination determining module 442

DETAILED DESCRIPTION OF THE EMBODIMENTS

The present disclosure is described in detail below with reference to specific embodiments. The following embodiments will help those skilled in the art to further understand the present disclosure, but do not limit the present disclosure in any way. It should be noted that several variations and improvements can also be made by a person of ordinary skill in the art without departing from the conception of the present disclosure. These all fall within the protection scope of the present disclosure.

It should be noted that the drawings provided in the embodiments merely illustrate the basic concepts of the present disclosure schematically. Therefore, the drawings only show components related to the present disclosure rather than being drawn according to the quantities, shapes, and sizes of components in actual implementation, patterns, quantities, and proportions of components in actual implementation may be changed randomly, and the component layout may be more complex.

As shown in FIG. 1, a data analysis-based energy-saving control method for a precision air conditioner in a cloud computing data center provided according to the present disclosure includes following steps.

Step S1: An initial training dataset is constructed by using historical sampling data, a time interval between each two adjacent sampling time points is defined as a sampling cycle, and a prediction cycle is defined for each sampling cycle, where a length of the prediction cycle is a prediction depth of a temperature difference prediction model, and an initial time point of the prediction cycle is an initial time point of a same sampling cycle, in other words, the initial time point of the prediction cycle is the initial time point of the sampling cycle defined for the prediction cycle; the initial training dataset is constructed by taking heat source data of a cloud server and control quantity data of a water-cooled precision air conditioner at the initial time point of the prediction cycle as input data of the model, and taking a measured sensor temperature difference at an end time point of the same prediction cycle as output data of the model; the heat source data includes performance data and temperature data of a component of the cloud server, the control quantity data includes an opening degree of an electric water valve and an air conditioning frequency, and a sensor temperature difference is a difference between a temperature at a return air position of the water-cooled precision air conditioner and a temperature at an air outlet position of the water-cooled precision air conditioner; and the measured sensor temperature difference is a difference between a temperature measured at the return air position of the water-cooled precision air conditioner and a temperature measured at the air outlet position of the water-cooled precision air conditioner.

Specifically, in order to improve prediction accuracy, the historical data in the initial training dataset is historical data of a single refrigeration region in a same cloud server data center. Although cloud server update or upgrade may occur in the cloud server data center, updating or upgrading a single server has a very limited impact on a thermodynamic process. Therefore, using the historical data of the same cloud server data center to train a sensor temperature difference prediction model for the cloud server data center can improve the prediction accuracy.

More Specifically, in a preferred embodiment, one prediction cycle consists of a plurality of consecutive sampling cycles, and an initial time point of the prediction period is the same as that of a first sampling cycle; and initial time points of two consecutive adjacent prediction cycles are initial time points of two consecutive adjacent sampling cycles. For example, it is assumed that there are ten sampling time points, which are denoted as T1, T2, . . . , and T10. A time interval between each sampling time point and a next sampling time point constitutes a sampling cycle. An initial time point of the sampling cycle is the sampling time point, and an end time point of the sampling cycle is the next sampling time point. Further, it is assumed that one prediction cycle consists of five sampling cycles. A first prediction cycle is a time interval from T1 to T6, a second prediction cycle is a time interval from T2 to T7, a third prediction cycle is a time interval from T3 to T8, and so on. An initial time point of one prediction cycle is synchronized with an initial time point of a corresponding sampling cycle, such that heat source data of the cloud server and control quantity data of the water-cooled precision air conditioner that are obtained at the initial time point of the sampling cycle can be used to train a Bayesian linear regression model and perform predictive control for a sensor temperature to make a prediction result match a training process of the prediction model.

The performance data includes following data: a fan speed of each cloud server node in a machine room; a frequency of a CPU of each cloud server node in the machine room; and memory usage of each cloud server node in the machine room. The temperature data includes following data: an inlet air temperature of each cloud server node in the machine room; an outlet air temperature of each cloud server node in the machine room; a temperature of the CPU of each cloud server node in the machine room; and a temperature of a GPU of each cloud server node in the machine room. The performance data may be obtained by a hardware management program of the cloud server by reading parameters of the CPU and other devices. The temperature data may be collected by a temperature sensor of the cloud server.

Step S2: The initial training dataset is pre-processed.

Figure 2:
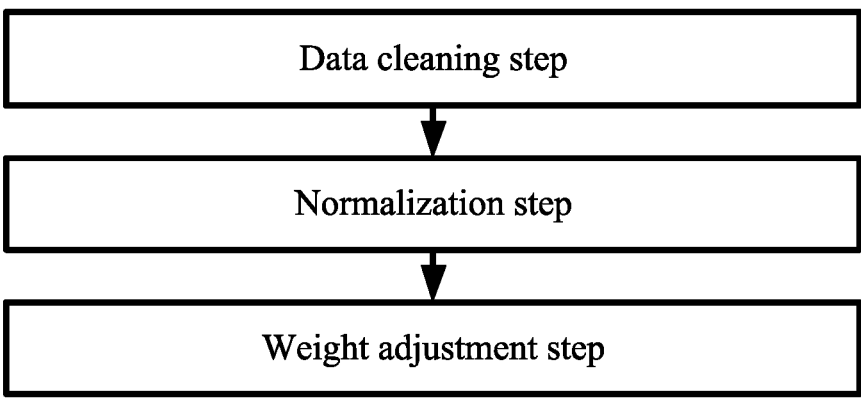
FIG. 2 is a flowchart of preprocessing steps in a whole method according to the present disclosure.

As shown in FIG. 2, specifically, data in the initial training dataset is not necessarily ideal. For example, a data loss and other problems exist. Therefore, it is necessary to pre-process the data in the initial training dataset. The pre-processing includes following steps:

a data cleaning step: if obtained value $$x_t''$$

of a sampling data item at sampling time point t is vacant value, the vacant value is filled with a historical average value of the data item;

a normalization step: for each data item, minimum and maximum values of the data item in the initial training dataset defined in the step S1 are denoted as $x_{min}$ and $x_{max}$ respectively, and original value $$x_t''$$

of the data item is mapped onto new value $$x_t'$$

that is approximately in interval [0,1], where a corresponding formula is:

$$x_t' = \frac{(x_t'' - x_{min})}{(x_{max} - x_{min})};$$

and a weight adjustment step: a relatively early training sample is set to have a low contribution to the Bayesian linear regression model, where a linear function corresponding to a contribution weight is:

$$w(t) = \alpha(t - t_0)$$

where w(t) represents a time-related contribution weight, $\alpha$ represents a parameter for adjusting a rate at which the contribution weight w(t) increases with time, t represents a current sampling time point, $t_0$ represents a historical first sampling time point, and $\alpha \in (0, +\infty)$; the value $$x_t'$$

of the data item is changed to new value $x_t$ through weight adjustment, where a corresponding formula is:

$$x_t = w(t)x_t'; \text{ and}$$

processed value $x_t$ of each data item in the training sample is combined into a pre-processed training sample as an input for initially training the Bayesian linear regression model in step S3 and incrementally training the Bayesian linear regression model in step S6.

It is considered herein that, for example, the cloud server itself may change historically, for example, the CPU and other components in the cloud server may also change historically due to replacement, and for another example, a customer application running in the cloud server may change with different historical time segments. In the present disclosure, weights of samples used for training the temperature difference prediction model are adjusted based on time. A weight value of a contribution degree of a relatively early training sample to the temperature difference prediction model is low. On the contrary, a weight value of a contribution degree of a relatively latest training sample to the temperature difference prediction model is large.

Step S3: The Bayesian linear regression model is initially trained based on pre-processed initial training data to obtain an initial temperature difference prediction model.

Specifically, the initial temperature difference prediction model is an initially trained Bayesian linear regression model. The initial training dataset is provided to the Bayesian linear regression model as an input for machine learning. The Bayesian linear regression model outputs a predicted sensor temperature. For example, it is assumed that there are 320 cloud servers in a machine room unit, and three kinds of performance data and four kinds of temperature data are obtained from each cloud server and used, together with the opening degree of the water valve of the water-cooled precision air conditioner and the air conditioning frequency of the water-cooled precision air conditioner, as inputs of the Bayesian linear regression model. The Bayesian linear regression model outputs a predicted sensor temperature difference.

More specifically, in a temperature change prediction, the Bayesian linear regression model is used for statistical reasoning. A Gaussian-anti-GAMMA probability distribution is selected as a conjugate prior distribution of a parameter of the Bayesian linear regression model. A posterior distribution obtained for the parameter of the Bayesian linear regression model through Bayesian reasoning using the initial training data is also a Gaussian-anti-GAMMA probability distribution. The prior distribution and the posterior distribution of the parameter of the Bayesian linear regression model are the same, which makes it possible to fast and incrementally train the Bayesian linear regression model online in the step S6, so as to fast, efficiently and accurately predict the temperature difference.

The Bayesian linear regression model is described in detail below.

Input sample set X of the Bayesian linear regression model is composed of input samples of n consecutive sampling cycles, which is denoted as: $X=\{X_1, X_2, \ldots, X_n\}$. represents X a matrix expression. $X_n$ represents an input sample obtained in an $n^{th}$ sampling cycle. In an application example of the present disclosure, input sample data includes the heat source data of the cloud server and the control quantity data of the water-cooled precision air conditioner. Output sample set y of the Bayesian linear regression model is composed of output samples of the n consecutive sampling cycles, which is denoted as: $y=\{y_1,$ $y_2, \ldots, y_n\}$. $y_n$ represents an output sample obtained in the $n^{th}$ sampling cycle. In an application example of the present disclosure, the output sample is measured sensor temperature difference data.

The Bayesian linear regression model is as follows:

$$\rho(y \mid X, \beta, \sigma^2) = (\sigma^2)^{-n/2} \exp\left(-\frac{1}{2\sigma^2}(y - X\beta)^T(y - X\beta)\right)$$

$\rho(y|X, \beta, \sigma^2)$ represents a conditional probability density function of the output sample set y under the given input sample set X and parameters $\beta$ and $\sigma^2$ of the Bayesian linear regression model. As mentioned in the above formula, a conditional probability of the output sample set y obeys an n-dimensional Gaussian distribution.

$\beta$ represents a weight vector of an input sample feature.

$\sigma^2$ represents a variance of a linear regression residual; and $\beta$ and $\sigma^2$ represent parameters that constitute the Bayesian linear regression model.

Next, prior probability distributions of the parameters $\beta$ and $\sigma^2$ of the Bayesian linear regression model are described.

Conjugate prior probability $\rho(\beta, \sigma^2)$ can be decomposed into $\rho(\beta, \sigma^2) = \rho(\sigma^2)\rho(\beta|\sigma^2)$ based on a Bayesian reasoning principle, and a Gaussian-anti-GAMMA probability distribution with hyper-parameters being $\mu_0$, $\Lambda_0$, $a_0$, and $b_0$ is selected as the prior probability distributions of the parameters $\beta$ and $\sigma^2$. A probability density function of the variance $\sigma^2$ is as follows:

$$\rho(\sigma^2) \propto (\sigma^2)^{-a_0-1} \exp\left(-\frac{b_0}{\sigma^2}\right)$$

The variance $\sigma^2$ obeys an anti-GAMMA$(a_0, b_0)$ distribution, where the parameters $a_0$ and $b_0$ are hyper-parameters of an anti-GAMMA distribution. In an application example of the present disclosure, $a_0=1$, and $b_0=1$.

For the given variance $\sigma^2$, a conditional probability density function of the weight vector $\beta$ is as follows:

$$\rho(\beta \mid \sigma^2) \propto (\sigma^2)^{-k/2} \exp\left(-\frac{1}{2\sigma^2}(\beta - \mu_0)^T \Lambda_0(\beta - \mu_0)\right)$$

For the given variance $\sigma^2$, $\beta$ obeys a $$\text{Gaussian}(\mu_0, \sigma^2\Lambda_0^{-1})$$

distribution, where the expected vector $\mu_0$ and the variance matrix $\Lambda_0$ are hyper-parameters of a k-dimensional Gaussian distribution. In an application example of the present disclosure, the hyper-parameters are set as follows:

$\mu_0$ is set to k-dimensional vector 0; the parameter $\Lambda_0$ is set to a k×k-order unit matrix. k represents a feature dimension of the input sample set X as an input quantity.

Next, posterior probability distributions of the model parameters $\beta$ and $\sigma^2$ are described.

The posterior distributions of the model parameters are calculated according to a following formula:

Parameter $$\rho(\beta, \sigma^2 \mid y, X) = \frac{\rho(y \mid X, \beta, \sigma^2) \times \rho(\beta, \sigma^2)}{\rho(y \mid X)}$$

$$\sigma^2 \Lambda_n^{-1}$$

In the above formula, $\rho(\beta, \sigma^2|y, X)$ represents a posterior probability density function of the model parameters under the given input sample set X and output sample set y. A posterior probability density is equal to output likelihood $\rho(y|X, \beta, \sigma^2)$ multiplied by prior probability density function $\rho(\beta, \sigma^2)$ of the given input parameters $\beta$ and $\sigma^2$ and then divided by a normalization constant.

For Bayesian linear regression, a posterior distribution is as follows:

$$\rho(\beta, \sigma^2 \mid y, X) \propto \rho(y \mid X, \beta, \sigma^2)\rho(\beta \mid \sigma^2)\rho(\sigma^2) \propto$$

$$(\sigma^2)^{-n/2}\exp\left(-\frac{1}{2\sigma^2}(y - X\beta)^T(y - X\beta)\right)$$

$$(\sigma^2)^{-k/2}\exp\left(-\frac{1}{2\sigma^2}(\beta - \mu_0)^T\Lambda_0(\beta - \mu_0)\right)(\sigma^2)^{-(a_0+1)}\exp\left(-\frac{b_0}{\sigma^2}\right) =$$

$$\rho(\beta, \sigma^2 \mid y, X) \propto (\sigma^2)^{-k/2}\exp\left(-\frac{1}{2\sigma^2}(\beta - \mu_n)^T(X^TX + \Lambda_0)(\beta - \mu_n)\right)$$

$$(\sigma^2)^{-\frac{n+2a_0}{2}-1}\exp\left(-\frac{2b_0 + y^Ty - \mu_n^T(X^TX + \Lambda_0)\mu_n + \mu_0^T\Lambda_0\mu_0}{2\sigma^2}\right) =$$

$$\rho(\beta \mid \sigma^2, y, X)\rho(\sigma^2 \mid y, X)$$

In the above formula, $\rho(\beta|\sigma^2, y, X)$ represents a density function of a Gaussian $$N(\mu_n, \sigma^2\Lambda_n^{-1})$$

distribution; and $\rho(\sigma^2|y, X)$ represents a density function of an anti-GAMMA$(a_n, b_n)$ distribution.

To sum up, after the model observes the input sample set X and the output sample set y, the posterior probability distributions of the parameters $\beta$ and $\sigma^2$ obey a Gaussian-anti-GAMMA distribution with hyper-parameters being $\mu_n$, $\Lambda_n$, $a_n$, and $b_n$. The hyper-parameters are calculated according to following formulas:

$$\mu_n = (X^TX + \Lambda_0)^{-1}(\Lambda_0\mu_0 + X^Ty)$$

$$\Lambda_n = (X^TX + \Lambda_0)$$

$$a_n = a_0 + \frac{n}{2}$$

$$b_n = b_0 + \frac{1}{2}(y^Ty + \mu_0^T\Lambda_0\mu_0 - \mu_n^T\Lambda_n\mu_n)$$

The parameter $\mu_n$ is an expected vector of the Gaussian $$N(\mu_n, \sigma^2\Lambda_n^{-1})$$

distribution.

is a variance matrix of the $$N(\mu_n, \sigma^2\Lambda_n^{-1})$$

distribution.

$a_n$, $b_n$ are hyper-parameters of the anti-GAMMA$(a_n, b_n)$ distribution.

Upon the above Bayesian statistical reasoning, an optimal Bayesian estimate of the initial training weight parameter $\beta$ of the input feature of the Bayesian linear regression is as follows:

$$\hat{\beta} = \mu_n$$

A predicted sensor temperature difference obtained at an end time point of prediction cycle m by using an initial optimal Bayesian linear regression model is expressed as $\hat{y}_m = X_m\hat{\beta}$, where $\hat{y}_m$ represents the predicted sensor temperature difference at the end time point of the prediction cycle m, and $X_m$ represents input performance data and temperature data at an initial time point of the prediction cycle m.

Step S4: A newly-added training dataset is obtained, where the newly-added training dataset includes: heat source data of the cloud server at an initial time point of a prediction cycle predicted at the end of an initial time point of a current sampling cycle, control quantity data of the water-cooled precision air conditioner at the initial time point of the prediction cycle predicted at the end of the initial time point of the current sampling cycle, and a measured sensor temperature difference of a machine room at an end time point of the prediction cycle predicted at the end of the initial time point of the current sampling cycle.

Step S5: The newly-added training dataset is pre-processed in a manner the same as that in the Step S2. In other words, the newly-added training dataset can be pre-processed with reference to steps in FIG. 2.

Step S6: The Bayesian linear regression model is incrementally trained online based on a pre-processed newly-added training dataset.

Specifically, the present disclosure updates the temperature difference prediction model online in real-time, to predict the sensor temperature difference in real time in a control process, namely, in a training process. The step S6 includes an incremental learning step. That is, a prediction cycle corresponding to current incremental training is set to t, and the parameters $\beta$ and $\sigma^2$ of the Bayesian linear regression model before an initial time point of the prediction cycle obey a Gaussian-anti-GAMMA probability distribution with hyper-parameters being $\mu_{t-1}$, $\Lambda_{t-1}$, $\alpha_{t-1}$, and $b_{t-1}$. In the current prediction cycle t, a sampling training sample at the initial time point of the prediction cycle t is added in the prediction cycle t to update the model parameters in the current prediction cycle t to obey a Gaussian-anti-GAMMA probability distribution with hyper-parameters being $\mu_t$, $\Lambda_t$, $a_t$, and $b_t$. All the hyper-parameters $\mu_t$, $\Lambda_t$, $a_t$, and $b_t$ are simple functions of $\mu_{t-1}$, $\Lambda_{t-1}$, $a_{t-1}$, $b_{t-1}$, and an incremental training sample, have analytical solutions, and can be calculated quickly and easily, thereby achieving online quick incremental training. In an application example of the present disclosure, the sampling cycle is set to 30 seconds. In the case of sufficient computing resources, time required to perform an incremental training prediction and output a control command for the Bayesian linear regression model each time is very short (less than 1 second), which can fully meet a design goal of real-time online control of the water-cooled precision air conditioner.

Next, the incremental training of the Bayesian linear regression model is described in detail below.

When a quantity of input samples n is >1, the Bayesian incremental training is expressed as follows:

$$\rho(\beta,\sigma^2|y_{1,\ldots,t},X_{1,\ldots,t})\propto\rho(y_t|X_t,\beta,\sigma^2)\times\rho(\beta,\sigma^2|y_{1,\ldots,t-1},X_{1,\ldots,t-1})$$

In the above formula, $\rho(\beta, \sigma^2|y_{1,\ldots,t}, X_{1,\ldots,t})$ represents a probability density function of the model parameters $\beta$ and $\sigma^2$ under a condition that all historical input sample sets $X_{1,\ldots,t}$ and all historical output sample sets are observed in sampling cycle t. This item is equal to a value by multiplying likelihood $\rho(y_n, |X_n, \beta, \sigma^2)$ of given input sample $X_t$ in the current sampling cycle and output sample $y_t$ in the current sampling cycle by a probability density function $\rho(\beta, \sigma^2|y_{1,\ldots,t-1}, X_{1,\ldots,t-1})$ of the model parameters $\beta$ and $\sigma^2$ under a condition that all historical input sample sets $X_{1,\ldots,t-1}$ and all historical output sample sets $y_{1,\ldots,t-1}$ are observed in sampling cycle n−1 and then normalizing an obtained product.

Specifically, as for the Bayesian linear regression, the posterior probability density function of the model parameters $\beta$ and $\sigma^2$ is set to be the Gaussian-anti-GAMMA distribution with the hyper-parameters being $\mu_{t-1}$, $\Lambda_{t-1}$, $a_{t-1}$, and $b_{t-1}$ in sampling cycle t−1, and in the sampling cycle t, after new training samples $X_t$ and $y_t$ are observed, the posterior probability density function of the model parameters $\beta$ and $\sigma^2$ is set to be the Gaussian-anti-GAMMA distribution with the hyper-parameters being $\mu_t$, $\Lambda_t$, $a_t$, and $b_t$. A hyper-parameter update formula, namely, an incremental training formula, is as follows:

$$\mu_t = \left(X_t^T X_t + \Lambda_{t-1}\right)^{-1}\left(\Lambda_{t-1}\mu_{t-1} + X_t^T y_t\right)$$

$$\Lambda_t = \left(X_t^T X_t + \Lambda_{t-1}\right)$$

$$a_t = a_{t-1} + \frac{1}{2}$$

$$b_t = b_{t-1} + \frac{1}{2}\left(y_t^T y_t + \mu_{t-1}^T \Lambda_{t-1}\mu_{t-1} - \mu_t^T \Lambda_t\mu_t\right)$$

Upon the above Bayesian statistical reasoning, in the current sampling cycle t, an optimal Bayesian estimate of the weight parameter $\beta$ of the input feature of Bayesian linear regression in the incremental training is as follows:

$$\hat{\beta}_t = \mu_t$$

A prediction of a sensor temperature difference at an end time point of the current prediction cycle t by using a current optimal incremental Bayesian linear regression model is expressed by a formula 1:

$$\hat{y}_t = X_t\hat{\beta}_t \qquad \text{(formula 1)}$$

In the above formula, $\hat{y}_t$ represents the predicted sensor temperature difference at the end time point of the prediction cycle t, and $X_t$ represents performance data and temperature data that are input to the model at the initial time point of the current prediction cycle t.

Step S7: Based on a current Bayesian linear regression model, by predicting, by using the formula 1 in the step S6, a sensor temperature difference at an end time point of a prediction cycle defined for the current sampling cycle, an optimal combination of the opening degree of the electric water valve and the air conditioning frequency are found, used, and implemented, where the process specifically includes: traversing predicted sensor temperature differences at an end time point of one prediction cycle starting from the current sampling cycle that are obtained by taking heat source data and each element in a gear combination set at the initial time point of the current sampling cycle as inputs of the current Bayesian linear regression model, and resetting the opening degree of the electric water valve and the air conditioning frequency in the current sampling cycle for the water-cooled precision air conditioner based on an element corresponding to a predicted sensor temperature difference less than and approximate to a target temperature difference threshold, where the gear combination set is a complete set of combinations obtained by pairing opening degrees of the electric water valve under different gears and air conditioning frequencies under the different gears.

Specifically, the present disclosure obtains an optimal control quantity of a combination of a frequency of a discrete compressor and the opening degree of the water valve in real time by using a grid search algorithm, so as to control an actual sensor temperature difference in the future to be less than a preset temperature difference threshold with a small energy consumption. The step S7 includes a grid search step. Specifically, the element corresponding to the predicted sensor temperature difference less than and approximate to the target temperature difference threshold is obtained based on the grid search algorithm by taking the heat source data and each element in the gear combination set as the inputs of the model, where a gear of the opening degree of the electric water valve and a gear of the air conditioning frequency are discrete gears.

More specifically, the discrete gears may be set for the opening degree of the electric water valve and the air conditioning frequency of the water-cooled precision air conditioner in the machine room, and a total quantity of gears is small. Then an optimal solution, namely, a combination of a minimum opening degree of the electric water valve and a minimum air conditioning frequency, which is approximate to the target temperature difference threshold, is further obtained by using the grid search algorithm, where the air conditioning frequency is a frequency of a wind turbine of the water-cooled precision air conditioner. For example, the opening degree of the electric water valve is set to have M gears, and a value of M may be 10; and the air conditioning frequency is set to have N gears, and a value of N may be 20. Therefore, M*N parameter combinations are enumerated based on the grid search algorithm. In the set, an (M, N) parameter pair is input to the current Bayesian linear regression model that is used as the temperature difference prediction model, and permutation and combination results of all values are traversed and cycled. A result in which a predicted temperature difference is greater than or equal to the target temperature difference threshold is eliminated, a combination of the opening degree of the electric water valve and the frequency of the wind turbine, which is corresponding to a predicted sensor temperature difference less than and approximate to the target temperature difference threshold, is found as an optimal solution control quantity, and the optimal solution control quantity, namely, the combination of the opening degree of the electric water valve and the frequency of the wind turbine, is used as an input control quantity of the water-cooled precision air conditioner. There are only 20*10 grids. Therefore, calculation time can be ignored, which does not affect a real-time requirement of training of the Bayesian linear regression model.

Step S8: Whether the process is over is determined; and if the process is over, the process is terminated; or if the process is not over, the step S4 is continuously performed for a next sampling cycle of the current sampling cycle.

Next, a data analysis-based refrigeration system for a cloud computing data center according to the present invention will be described in detail based on a preferred embodiment of data center 100 in combination with more accompanying drawings.

Figure 3:
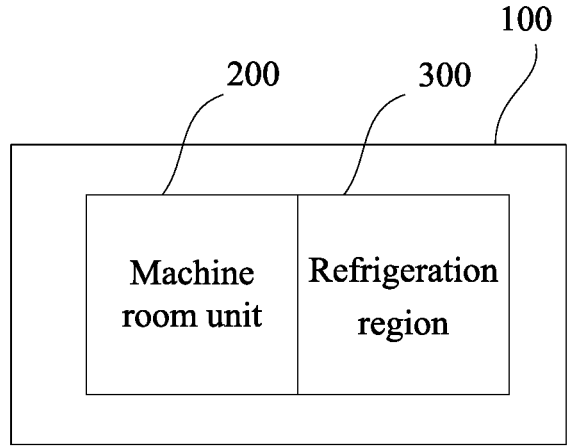
FIG. 3 is a schematic structural diagram of a data center according to an embodiment of the present disclosure.

As shown in FIG. 3, in this embodiment, the data center 100 includes a data analysis-based refrigeration system for a cloud computing data center. The data analysis-based refrigeration system for a cloud computing data center includes machine room unit 200 and refrigeration region 300. The refrigeration region 300 is located on one side of the machine room unit 200, and provides cold air for the machine room unit 200.

Figure 4:
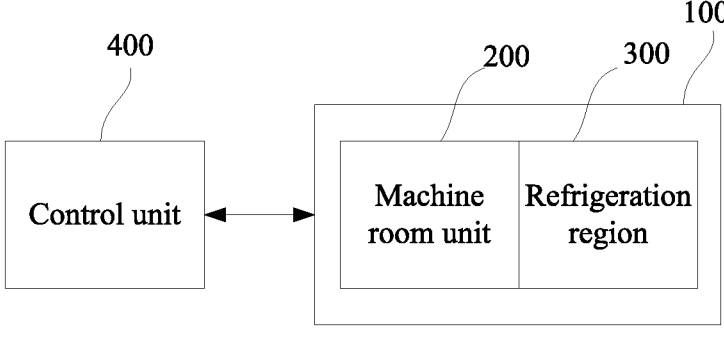
FIG. 4 is a schematic diagram of a control relationship of a control unit according to an embodiment of the present disclosure.

As shown in FIG. 4, the data analysis-based refrigeration system for a cloud computing data center further includes control unit 400. The control unit 400 performs data collection and control on devices in the machine room unit 200 and the refrigeration region 300. The control unit 400 includes a computer-readable storage medium storing a computer program, to control an opening degree of an electric water valve of water-cooled precision air conditioner 320 and an air conditioning frequency of the water-cooled precision air conditioner 320.

Figure 5:
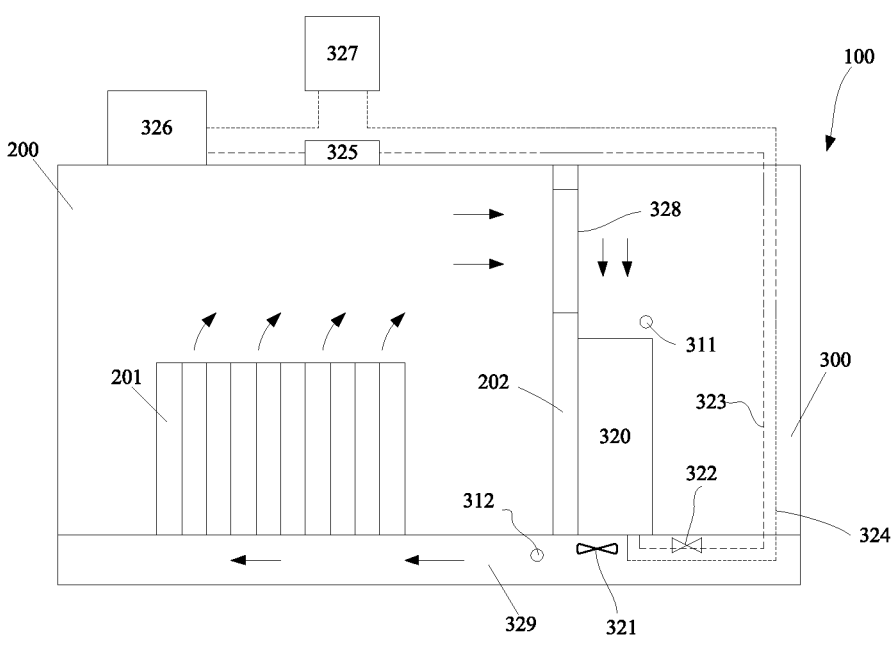
FIG. 5 is a schematic structural diagram of a water-cooled precision air conditioner refrigeration unit according to an embodiment of the present disclosure.

As shown in FIG. 5, in this embodiment, the machine room unit 200 is provided with a cloud server.

The refrigeration region 300 is disposed on one side of the machine room unit 200, where the refrigeration region 300 is connected to the machine room unit 200 through air supply channel 329, the cold air generated by the refrigeration region 300 enters the machine room unit 200 through the air supply channel 329, and the refrigeration region 300 is provided with a water-cooled precision air conditioner refrigeration unit.

The water-cooled precision air conditioner refrigeration unit includes:

the water-cooled precision air conditioner 320 configured to cool air from the machine room unit 200;

the electric water valve 322 disposed on chilled water return pipe 323 of the water-cooled precision air conditioner 320;

first sensor 311 disposed in the refrigeration region 300 and located at a return air position of the water-cooled precision air conditioner 320, where the first sensor 311 is electrically connected to the control unit 400, the first sensor 311 is configured to collect a temperature of hot air entering the water-cooled precision air conditioner 320 and send the collected temperature to the control unit 400, and the control unit 400 defines the temperature sent by the first sensor 311 as a temperature at the return air position; and second sensor 312 disposed within the air supply channel 329 and located at a bottom of the water-cooled precision air conditioner 320, where the second sensor 312 is electrically connected to the control unit 400, the second sensor 312 is configured to collect a temperature of cold air output by the water-cooled precision air conditioner 320 and send the collected temperature to the control unit 400, and the control unit 400 defines the temperature sent by the second sensor 312 as a temperature at an air outlet position.

More specifically, the refrigeration region 300 is disposed on one side of the machine room unit 200. The machine room unit 200 includes server cabinet 201 and wall body 202. The server cabinet 201 is disposed in the machine room unit 200, the machine room unit 200 is separated from the refrigeration region 300 by the wall body 202, and the wall body 202 is provided with hot air channel 328 connecting the machine room unit 200 and the refrigeration region 300. In this embodiment, the machine room unit 200 may include at least two columns of server cabinets 201, two columns of server cabinets 201 may be disposed back to back, and there are a plurality of servers in each column of server cabinets 201. A hot channel is formed between two adjacent columns of server cabinets 201, that is, heat generated by the server cabinets 201 flows out of the hot channel and enters the refrigeration region 300 through the hot air channel 328.

In this embodiment, both the first sensor 311 and the second sensor 312 are electrically connected to the control unit 400. As shown in FIG. 5, the first sensor 311 is disposed in the refrigeration region 300 and located at the return air position of the water-cooled precision air conditioner 320. The second sensor 312 is disposed within the air supply channel 329 and located below the water-cooled precision air conditioner 320.

As shown in FIG. 5, the water-cooled precision air conditioner refrigeration unit includes the water-cooled precision air conditioner 320, wind turbine 321, the electric water valve 322, chilled water circulating pump 325, helical-lobe compressor 326, and cold storage tank 327. In this embodiment, the water-cooled precision air conditioner 320 is connected to the chilled water circulating pump 325 through the chilled water return pipe 323, and then connected to the helical-lobe compressor 326. The helical-lobe compressor 326 is connected to the cold storage tank 327, and the cold storage tank 327 is connected to the water-cooled precision air conditioner 320 through chilled water supply pipe 324. The water-cooled precision air conditioner 320, the chilled water circulating pump 325, the helical-lobe compressor 326, and the cold storage tank 327 form a circulating waterway. The cold air generated in the refrigeration region 300 enters the machine room unit 200 through the air supply channel 329.

Figure 6:
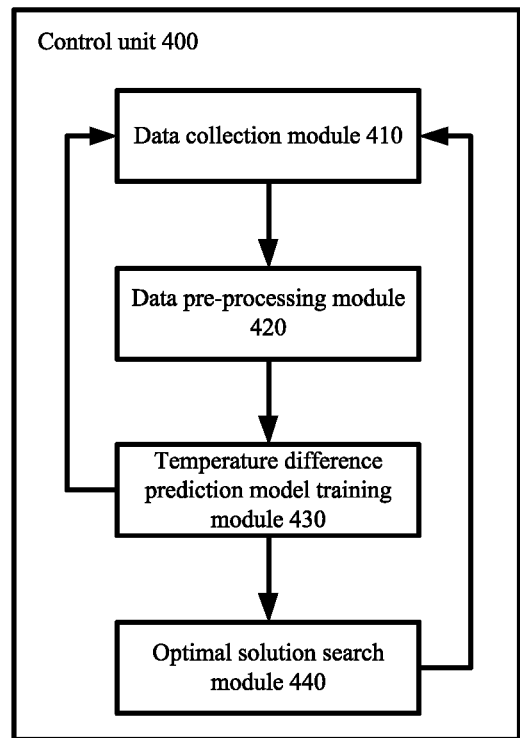
FIG. 6 is a schematic structural diagram of a control unit according to the present disclosure.

As shown in FIG. 6, in a preferred embodiment, the computer-readable storage medium storing the computer program in the control unit specifically includes following corresponding program modules, in other words, the control unit includes a data analysis-based energy-saving control system for a precision air conditioner in a cloud computing data center, including following modules:

data collection module 410 configured to collect heat source data of the cloud server, control quantity data of the water-cooled precision air conditioner, and a measured sensor temperature difference;

data pre-processing module 420 configured to pre-process the data collected by the data collection module 410;

temperature difference prediction model training module 430 configured to train a Bayesian linear regression model based on pre-processed data; and optimal solution search module 440 configured to find an optimal combination of the opening degree of the electric water valve and the air conditioning frequency based on the Bayesian linear regression model, and use and implement the optimal combination.

In an initial training stage of the Bayesian linear regression model for predicting a sensor temperature difference, the data collection module 410 first collects historical heat source data of the cloud server, historical control quantity data of the water-cooled precision air conditioner, and a historical measured sensor temperature difference, and sends the collected historical data to the data pre-processing module 420 for data pre-processing. Then, the data pre-processing module 420 pre-processes the data collected by the data collection module 410, sends pre-processed data to the temperature difference prediction model training module 430 to initially train the Bayesian linear regression model. Finally, the temperature difference prediction model training module 430 uses the pre-processed data generated by the data pre-processing module 420 to initially train the Bayesian linear regression model to obtain an initial Bayesian linear regression prediction model.

In stages of performing online incremental training for the Bayesian linear regression model and performing optimal control quantity search and control, in each cycle of performing the online incremental training for the Bayesian linear regression model and performing the optimal control quantity search and control, the data collection module 410 first collects heat source data of the cloud server, control quantity data of the water-cooled precision air conditioner, and a measured sensor temperature difference in a prediction cycle ending at an initial time point of a current sampling cycle, uses the collected data as an incremental training sample, and sends the collected incremental training data to the data pre-processing module 420 for data pre-processing. Then, the data pre-processing module 420 pre-processes the incremental training sample collected by the data collection module 410, sends a pre-processed incremental training sample to the temperature difference prediction model training module 430 to incrementally train the Bayesian linear regression model. After that, the temperature difference prediction model training module 430 uses the pre-processed incremental training sample generated by the data pre-processing module 420 to incrementally train the Bayesian linear regression prediction model, updates a Bayesian linear regression prediction model, and triggers the optimal solution search module 440. The optimal solution search module 440 finds the optimal combination of the opening degree of the electric water valve and the air conditioning frequency based on a latest Bayesian linear regression model, and uses and implements the optimal combination. After completing its work, the optimal solution search module 440 automatically triggers the data collection module 410 to perform collection to start a next cycle of performing the online incremental training for the Bayesian linear regression and performing the optimal control quantity search and control.

Figure 7:
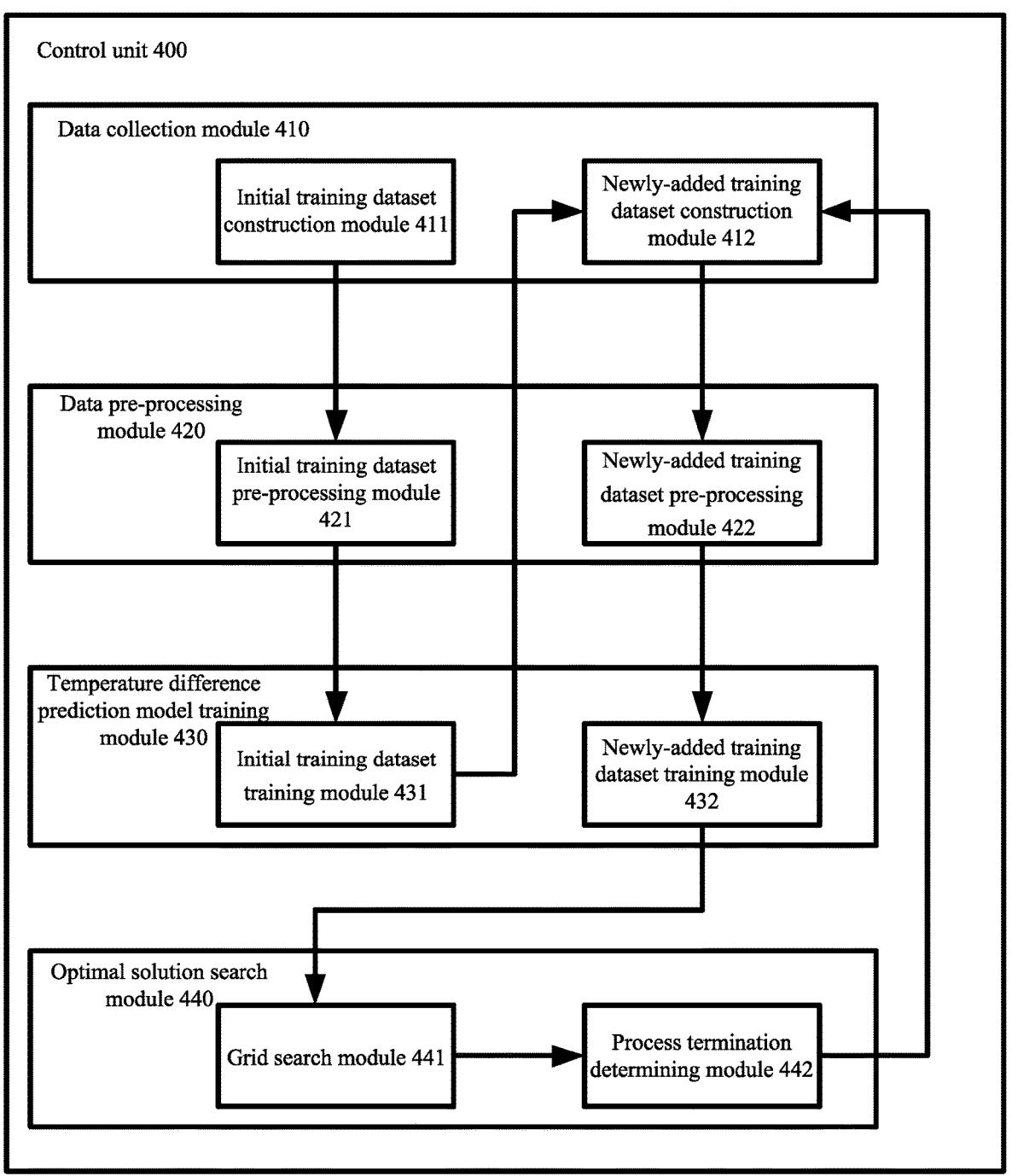
FIG. 7 is a detailed schematic structural diagram of a control unit according to the present disclosure.

As shown in FIG. 7, the data collection module 410 includes initial training dataset construction module 411 and newly-added training dataset construction module 412.

The data pre-processing module 420 includes initial training dataset pre-processing module 421 and newly-added training dataset pre-processing module 422.

The temperature difference prediction model training module 430 includes initial training dataset training module 431 and newly-added training dataset training module 432.

The optimal solution search module 440 includes grid search module 441 and process termination determining module 442.

The initial training dataset construction module 411 constructs an initial training dataset by using historical sampling data, defines a time interval between each two adjacent sampling time points as a sampling cycle, and defines a prediction cycle for each sampling cycle, where a length of the prediction cycle is a prediction depth of a temperature difference prediction model, and an initial time point of the prediction cycle is an initial time point of a same sampling cycle, in other words, the initial time point of the prediction cycle is the initial time point of the sampling cycle defined for the prediction cycle; the initial training dataset is constructed by taking heat source data of the cloud server and control quantity data of the water-cooled precision air conditioner at the initial time point of the prediction cycle as input data of the model, and taking a measured sensor temperature difference at an end time point of the same prediction cycle as output data of the model; the heat source data includes performance data and temperature data of a component of the cloud server, the control quantity data includes the opening degree of the electric water valve and the air conditioning frequency, and the sensor temperature difference is a difference between the temperature at the return air position of the water-cooled precision air conditioner and the temperature the air outlet position of the water-cooled precision air conditioner; and the measured sensor temperature difference is a difference between a temperature measured at the return air position of the water-cooled precision air conditioner and a temperature measured at the air outlet position of the water-cooled precision air conditioner. The initial training dataset construction module 411 sends the constructed initial training dataset to the initial training dataset pre-processing module 421 for further processing.

The initial training dataset pre-processing module 421 pre-processes the initial training dataset, and provides pre-processed initial training data to the initial training dataset training module 431 for model training.

The initial training dataset training module 431 initially trains the Bayesian linear regression model based on the pre-processed initial training data to obtain an initial temperature difference prediction model.

Specifically, the initial temperature difference prediction model is an initially trained Bayesian linear regression model. The initial training dataset is provided to the Bayesian linear regression model as an input for machine learning. The Bayesian linear regression model outputs a predicted sensor temperature. For example, it is assumed that there are 320 cloud servers in a machine room unit, and three kinds of performance data and four kinds of temperature data are obtained from each cloud server and used, together with the opening degree of the water valve of the water-cooled precision air conditioner and the air conditioning frequency of the water-cooled precision air conditioner, as inputs of the Bayesian linear regression model. The Bayesian linear regression model outputs a predicted sensor temperature difference.

More specifically, in a temperature change prediction, the Bayesian linear regression model is used for statistical reasoning. A Gaussian-anti-GAMMA probability distribution is selected as a conjugate prior distribution of a parameter of the Bayesian linear regression model. A posterior distribution of the parameter of the Bayesian linear regression model that is obtained through Bayesian reasoning using the initial training data is also a Gaussian-anti-GAMMA probability distribution. The prior distribution and the posterior distribution of the parameter of the Bayesian linear regression model are the same, which makes it possible to fast and incrementally train the Bayesian linear regression model online, so as to fast, efficiently and accurately predict a temperature difference.

The Bayesian linear regression model is described in detail below.

Input sample set X of the Bayesian linear regression model is composed of input samples of n consecutive sampling cycles, which is denoted as: $X=\{X_1, X_2, \ldots, X_n\}$. represents X a matrix expression. $X_n$ represents an input sample obtained in an $n^{th}$ sampling cycle. In an application example of the present disclosure, input sample data includes the heat source data of the cloud server and the control quantity data of the water-cooled precision air conditioner. Output sample set y of the Bayesian linear regression model is composed of output samples of the n consecutive sampling cycles, which is denoted as: $y=\{y_1, y_2, \ldots, y_n\}$. $y_n$ represents an output sample obtained in the $n^{th}$ sampling cycle. In an application example of the present disclosure, the output sample is measured sensor temperature difference data.

The Bayesian linear regression model is as follows:

$$\rho\left(y \mid X, \beta, \sigma^2\right) = \left(\sigma^2\right)^{-n/2} \exp\left(-\frac{1}{2\sigma^2}(y - X\beta)^T(y - X\beta)\right)$$

$\rho(y|X, \beta, \sigma^2)$ represents a conditional probability density function of the output sample set y under the given input sample set X and parameters $\beta$ and $\sigma^2$ of the Bayesian linear regression model. As mentioned in the above formula, a conditional probability of the output sample set y obeys an n-dimensional Gaussian distribution.

$\beta$ represents a weight vector of an input sample feature.

$\sigma^2$ represents a variance of a linear regression residual; and $\beta$ and $\sigma^2$ represent parameters that constitute the Bayesian linear regression model.

Next, prior probability distributions of the parameters $\beta$ and $\sigma^2$ of the Bayesian linear regression model are described.

Conjugate prior probability $\rho(\beta, \sigma^2)$ can be decomposed into $\rho(\beta, \sigma^2)=p(\sigma^2)\rho(\beta|\sigma^2)$ based on a Bayesian reasoning principle, and a Gaussian-anti-GAMMA probability distribution with hyper-parameters being $\mu_0$, $\Lambda_0$, $a_0$, and $b_0$ is selected as the prior probability distributions of the parameters $\beta$ and $\sigma^2$. A probability density function of the variance $\sigma^2$ is as follows:

$$\rho\left(\sigma^2\right) \propto \left(\sigma^2\right)^{-a_0-1} \exp\left(-\frac{b_0}{\sigma^2}\right)$$

The variance $\sigma^2$ obeys an anti-GAMMA($a_0$, $b_0$) distribution, where the parameters $a_0$ and $b_0$ are hyper-parameters of an anti-GAMMA distribution. In an application example of the present disclosure, $a_0=1$, and $b_0=1$.

For the given variance $\sigma^2$, a conditional probability density function of the weight vector $\beta$ is as follows:

$$\rho\left(\beta \mid \sigma^2\right) \propto \left(\sigma^2\right)^{-k/2} \exp\left(-\frac{1}{2\sigma^2}(\beta - \mu_0)^T \Lambda_0(\beta - \mu_0)\right)$$

For the given variance $\sigma^2$, $\beta$ obeys a

Gaussian $\left(\mu_0, \sigma^2 \Lambda_0^{-1}\right)$ distribution, where the expected vector $\mu_0$ and the variance matrix $\Lambda_0$ are hyper-parameters of a k-dimensional Gaussian distribution. In an application example of the present disclosure, the hyper-parameters are set as follows:

$\mu_0$ is set to k-dimensional vector 0; the parameter $\Lambda_0$ is set to a k×k-order unit matrix. k represents a feature dimension of the input sample set X as an input quantity.

Next, posterior probability distributions of the model parameters $\beta$ and $\sigma^2$ are described.

The posterior distributions of the model parameters are calculated according to a following formula:

$$\rho\left(\beta, \sigma^2 \mid y, X\right) = \frac{\rho\left(y \mid X, \beta, \sigma^2\right) \times \rho\left(\beta, \sigma^2\right)}{\rho(y \mid X)}$$

In the above formula, $\rho(\beta, \sigma^2|y, X)$ represents a posterior probability density function of the model parameters under the given input sample set X and output sample set y. A posterior probability density is equal to output likelihood $\rho(y|X, \beta, \sigma^2)$ multiplied by prior probability density function $\rho(\beta, \sigma^2)$ of the given input parameters $\beta$ and $\sigma^2$ and then divided by a normalization constant.

For Bayesian linear regression, a posterior distribution is as follows:

$$\rho\left(\beta, \sigma^2 \mid y, X\right) \propto \rho\left(y \mid X, \beta, \sigma^2\right)\rho\left(\beta \mid \sigma^2\right)\rho\left(\sigma^2\right) \propto$$

$$\left(\sigma^2\right)^{-n/2} \exp\left(-\frac{1}{2\sigma^2}(y - X\beta)^T(y - X\beta)\right)$$

$$\left(\sigma^2\right)^{-k/2} \exp\left(-\frac{1}{2\sigma^2}(\beta - \mu_0)^T \Lambda_0(\beta - \mu_0)\right)\left(\sigma^2\right)^{-(a_0+1)} \exp\left(-\frac{b_0}{\sigma^2}\right) =$$

$$\rho\left(\beta, \sigma^2 \mid y, X\right) \propto \left(\sigma^2\right)^{-k/2} \exp\left(-\frac{1}{2\sigma^2}(\beta - \mu_n)^T\left(X^T X + \Lambda_0\right)(\beta - \mu_n)\right)$$

$$\left(\sigma^2\right)^{-\frac{n+2a_0}{2}-1}\left(-\frac{2b_0 + y^T y - \mu_n^T\left(X^T X + \Lambda_0\right)\mu_n + \mu_0^T \Lambda_0 \mu_0}{2\sigma^2}\right) =$$

$$\rho\left(\beta \mid \sigma^2, y, X\right)\rho\left(\sigma^2 \mid y, X\right)$$

In the above formula, $\rho(\beta|\sigma^2, y, X)$ represents a density function of a Gaussian $$N\left(\mu_n, \sigma^2 \Lambda_n^{-1}\right)$$

distribution; and $\rho(\sigma^2|y, X)$ represents a density function of an anti-GAMMA($a_n$, $b_n$) distribution.

To sum up, after the model observes the input sample set X and the output sample set y, the posterior probability distributions of the parameters $\beta$ and $\sigma^2$ obey a Gaussian-anti-GAMMA distribution with hyper-parameters being $\mu_n$, $\Lambda_n$, $a_n$, and $b_n$. The hyper-parameters are calculated according to following formulas:

$$\mu_n = \left(X^T X + \Lambda_0\right)^{-1}\left(\Lambda_0 \mu_0 + X^T y\right)$$

$$\Lambda_n = \left(X^T X + \Lambda_0\right)$$

$$a_n = a_0 + \frac{n}{2}$$

-continued $$b_n = b_0 + \frac{1}{2}\left(y^T y + \mu_0^T \Lambda_0 \mu_0 - \mu_n^T \Lambda_n \mu_n\right)$$

The parameter $\mu_n$ is an expected vector of the Gaussian $$N\left(\mu_n, \sigma^2 \Lambda_n^{-1}\right)$$

distribution.

Parameter $$\sigma^2 \Lambda_n^{-1}$$

is a variance matrix of the $$N\left(\mu_n, \sigma^2 \Lambda_n^{-1}\right)$$

distribution.

$a_n$, $b_n$ are hyper-parameters of the anti-GAMMA($a_n$, $b_n$) distribution.

Upon the above Bayesian statistical reasoning, an optimal Bayesian estimate of the initial training weight parameter $\beta$ of the input feature of the Bayesian linear regression in the initial training is as follows:

$$\hat{\beta} = \mu_n$$

A predicted sensor temperature difference obtained at an end time point of prediction cycle m by using an initial optimal Bayesian linear regression model is expressed as $\hat{y}_m = X_m \hat{\beta}$, where $\hat{y}_m$ represents the predicted sensor temperature difference at the end time point of the prediction cycle m, and $X_m$ represents input performance data and temperature data at an initial time point of the prediction cycle m.

After obtaining the initial temperature difference prediction model, the system enters the stages of performing the online incremental training for the Bayesian linear regression model and performing the optimal control quantity search and control. In a first cycle of performing the online incremental training for the Bayesian linear regression model and performing the optimal control quantity search and control, the initial training dataset training module 431 triggers the newly-added training dataset construction module 412 to collect newly-added training data.

The newly-added training dataset construction module 412 obtains a newly-added training dataset, where the newly-added training dataset includes: heat source data of the cloud server at the initial time point of the prediction cycle ending at the initial time point of the current sampling cycle, control quantity data of the water-cooled precision air conditioner at the initial time point of the prediction cycle ending at the initial time point of the current sampling cycle, and a measured sensor temperature difference of a machine room at an end time point of the prediction cycle ending at the initial time point of the current sampling cycle. Then, the newly-added training dataset construction module 412 sends the obtained newly-added training dataset to the newly-added training dataset preprocessing module 422.

The newly-added training dataset pre-processing module 422 pre-processes the newly-added training dataset, and provides a pre-processed newly-added training dataset to the newly-added training dataset training module 432 for incremental model training.

The newly-added training dataset training module 432 incrementally trains the Bayesian linear regression model online based on the pre-processed newly-added training dataset.

Specifically, the present disclosure updates the temperature difference prediction model online in real-time, to predict the sensor temperature difference in real time in a control process, namely, in a training process. The newly-added training dataset training module 432 includes an incremental learning module. A prediction cycle corresponding to current incremental training is set to t, and the parameters $\beta$ and $\sigma^2$ of the Bayesian linear regression model before an initial time point of the prediction cycle obey a Gaussian-anti-GAMMA probability distribution with hyper-parameters being $\mu_{t-1}$, $\Lambda_{t-1}$, $a_{t-1}$, and $b_{t-1}$. In the current prediction cycle t, a sampling training sample at the initial time point of the prediction cycle t is added in the current prediction cycle t to update the model parameters in the current prediction cycle t to obey a Gaussian-anti-GAMMA probability distribution with hyper-parameters being $\mu_t$, $\Lambda_t$, $a_t$, and $b_t$. All the hyper-parameters $\mu_t$, $\Lambda_t$, $a_t$, and $b_t$ are simple functions of $\mu_{t-1}$, $\Lambda_{t-1}$, $a_{t-1}$, $b_{t-1}$, and an incremental training sample, have analytical solutions, and can be calculated quickly and easily, thereby achieving online quick incremental training. In an application example of the present disclosure, the sampling cycle is set to 30 seconds. In the case of sufficient computing resources, time required to perform an incremental training prediction and output a control command for the Bayesian linear regression model each time is very short (less than 1 second), which can fully meet a design goal of real-time online control of the water-cooled precision air conditioner.

Next, the incremental training of the Bayesian linear regression model is described in detail below.

When a quantity of input samples n is >1, the Bayesian incremental training is expressed as follows:

$$\rho(\beta, \sigma^2 | y_{1, \ldots, t}, X_{1, \ldots, t}) \propto \rho(y_t | X_t, \beta, \sigma^2) \times$$
$$\rho(\beta, \sigma^2 | y_{1, \ldots, t-1}, X_{1, \ldots, t-1})$$

In the above formula, $\rho(\beta, \sigma^2 | y_{1, \ldots, t}, X_{1, \ldots, t})$ represents a probability density function of the model parameters $\beta$ and $\sigma^2$ under a condition that all historical input sample sets $X_{1, \ldots, t}$ and all historical output sample sets are observed in sampling cycle t. This item is equal to a value by multiplying likelihood $\rho(y_n | X_n, \beta, \sigma^2)$ of given input sample $X_t$ in the current sampling cycle and output sample $y_t$ in the current sampling cycle by a probability density function $\rho(\beta, \sigma^2 | y_{1, \ldots, n-1}, X_{1, \ldots, n-1})$ of the model parameters $\beta$ and $\sigma^2$ under a condition that all historical input sample sets $X_{1, \ldots, t-1}$ and all historical output sample sets $y_{1, \ldots, t-1}$ are observed in sampling cycle n−1 and then normalizing a corresponding product.

Specifically, as for the Bayesian linear regression, the posterior probability density function of the model parameters $\beta$ and $\sigma^2$ is set to be the Gaussian-anti-GAMMA distribution with the hyper-parameters being $\mu_{t-1}$, $\Lambda_{t-1}$, $a_{t-1}$, and $b_{t-1}$ in sampling cycle t−1, and in the sampling cycle t, after new training samples $X_t$ and $y_t$ are observed, the posterior probability density function of the model parameters $\beta$ and $\sigma^2$ is set to be the Gaussian-anti GAMMA distribution with the hyper-parameters being $\mu_t$, $\Lambda_t$, $a_t$, and

25

$b_t$. A hyper-parameter update formula, namely, an incremental training formula, is as follows:

$$\mu_t = \left(X_t^T X_t + \Lambda_{t-1}\right)^{-1}\left(\Lambda_{t-1}\mu_{t-1} + X_t^T y_t\right)$$

$$\Lambda_t = \left(X_t^T X_t + \Lambda_{t-1}\right)$$

$$a_t = a_{t-1} + \frac{1}{2}$$

$$b_t = b_{t-1} + \frac{1}{2}\left(y_t^T y_t + \mu_{t-1}^T \Lambda_{t-1}\mu_{t-1} - \mu_t^T \Lambda_t \mu_t\right)$$

Upon the above Bayesian statistical reasoning, in the current sampling cycle t, an optimal Bayesian estimate of the weight parameter β of the input feature of Bayesian linear regression in the incremental training is as follows:

$$\hat{\beta}_t = \mu_t$$

A prediction of a sensor temperature difference at an end time point of the current prediction cycle t by using a current optimal incremental Bayesian linear regression model is expressed by a formula 1:

$$\hat{y}_t = X_t \hat{\beta}_t \qquad \text{(formula 1)}$$

In the above formula, $\hat{y}_t$ represents the predicted sensor temperature difference at the end time point of the prediction cycle t, and $X_t$ represents performance data and temperature data that are input to the model at the initial time point of the current prediction cycle t.

After incrementally trains the Bayesian linear regression model online based on the pre-processed newly-added training dataset, the newly-added training dataset training module 432 triggers the grid search module 441 for further processing.

Based on a current Bayesian linear regression model, by predicting, by using the formula 1 of the newly-added training dataset training module 432, a sensor temperature difference at an end time point of a prediction cycle defined for the current sampling cycle, the grid search module 441 finds the optimal combination of the opening degree of the electric water valve and the air conditioning frequency, and uses and implements the optimal combination. Specifically, the grid search module 441 traverses predicted sensor temperature differences at the end time point of the prediction cycle defined for the current sampling cycle that are obtained by taking heat source data and each element in a gear combination set at the initial time point of the current sampling cycle as inputs of the current Bayesian linear regression model, and resets the opening degree of the electric water valve and the air conditioning frequency for the water-cooled precision air conditioner in the current sampling cycle based on an element corresponding to a predicted sensor temperature difference less than and approximate to a target temperature difference threshold, where the gear combination set is a complete set of combinations obtained by pairing opening degrees of the electric water valve under different gears and air conditioning frequencies under the different gears; and then triggers the process termination determining module 442 to determine whether the process is over.

The process termination determining module 442 determines whether the process is over. If the process is over, the process is terminated. If the process is not over, the system enters a next cycle of performing the online incremental training for the Bayesian linear regression and performing the optimal control quantity search and control, and jumps back to trigger the newly-added training dataset construction module 412 for a next sampling cycle of the current sampling cycle to continue to collect new-newly training data.

Further, the performance data in the initial training dataset construction module 411 and the newly-added training dataset construction module 412 includes any one or more kinds of following data:

a fan speed of each cloud server node in the machine room;

a frequency of a CPU of each cloud server node in the machine room; and memory usage of each cloud server node in the machine room; and the temperature data includes any one or more kinds of following data:

an inlet air temperature of each cloud server node in the machine room;

an outlet air temperature of each cloud server node in the machine room;

a temperature of the CPU of each cloud server node in the machine room; and a temperature of a GPU of each cloud server node in the machine room.

Further, the initial training dataset pre-processing module 421 and the newly-added training dataset pre-processing module 422 include following modules:

a data cleaning module configured to, if obtained value $$x_t''$$

of a sampling data item at sampling time point t is vacant value, fill the vacant value with a historical average value of the data item;

a normalization module: for each data item, minimum and maximum values of the data item in the initial training dataset defined by the initial training dataset construction module 411 are denoted as $x_{min}$ and $x_{max}$ respectively, and original $$value x_t''$$

of the data item is mapped onto new value $$x_t'$$

that is approximately in interval [0,1], where a corresponding formula is:

$$x_t' = \frac{(x_t'' - x_{min})}{(x_{max} - x_{min})};$$

and a weight adjustment module configured to set a relatively early training sample to have a low contribution to the Bayesian linear regression model, where a linear function corresponding to a contribution weight is:

$$w(t) = \alpha(t - t_0)$$

where w(t) represents a time-related contribution weight, $\alpha$ represents a parameter for adjusting a rate at which the contribution weight w(t) increases with time, t represents a current sampling time point, $t_0$ represents a historical first sampling time point, and $\alpha \in (0, +\infty)$; the value $$x_t'$$

of the data item is changed to new value $x_t$ through weight adjustment, where a corresponding formula is:

$$x_t = w(t)x_t; \text{ and}$$

processed value $x_t$ of each data item in the training sample is combined into a pre-processed training sample as an input used by the initial training dataset training module 431 to initially train the Bayesian linear regression model and used by the newly-added training dataset training module 432 to incrementally train the Bayesian linear regression model.

Further, the initial training dataset training module 431 includes:

an initial learning module configured to select a Gaussian-anti-GAMMA prior probability distribution, such that the online incremental training can be performed after the initial training is completed for the Bayesian linear regression model.

The newly-added training dataset training module 432 includes:

an incremental learning module configured to select the Gaussian-anti-GAMMA prior probability distribution, such that the online incremental training can be performed after the initial training is completed for the Bayesian linear regression model.

Further, the initial training dataset construction module 411 includes:

the grid search module configured to obtain, based on the heat source data and each element in the gear combination set by using a grid search algorithm, the element corresponding to the predicted sensor temperature difference less than and approximate to the target temperature difference threshold, where a gear of the opening degree of the electric water valve and a gear of the air conditioning frequency are discrete gears.

Further, one prediction cycle consists of a plurality of consecutive sampling cycles, and an initial time point of the prediction period is the same as that of a first sampling cycle; and initial time points of two consecutive adjacent prediction cycles are initial time points of two consecutive adjacent sampling cycles.

Those skilled in the art can understand the data analysis-based energy-saving control method for a precision air conditioner in a cloud computing data center as a specific embodiment of the data analysis-based energy-saving control system for a precision air conditioner in a cloud computing data center, in other words, the data analysis-based energy-saving control system for a precision air conditioner in a cloud computing data center can be realized by performing the steps of the data analysis-based energy-saving control method for a precision air conditioner in a cloud computing data center. Those skilled in the art are aware that in addition to being realized by using pure computer-readable program code, the program modules in the data analysis-based refrigeration system for a cloud computing data center can realize a same program in a form of a logic gate, a switch, an application-specific integrated circuit, a programmable logic controller, or an embedded microcontroller by performing logic programming on the method steps. Therefore, the program modules provided in the present disclosure can be regarded as a kind of hardware component. The program submodules included therein for realizing various programs can also be regarded as structures in the hardware component; and the modules for realizing various functions can also be regarded as software programs for implementing the method or structures in the hardware component.

The specific embodiments of the present disclosure are described above. It should be understood that the present disclosure is not limited to the above specific implementations, and a person skilled in the art can make various variations or modifications within the scope of the claims without affecting the essence of the present disclosure. The embodiments in the present disclosure and features in the embodiments may be freely combined with each other in a non-conflicting manner.

What is claimed is:

1. A data analysis-based energy-saving control method for a precision air conditioner in a cloud computing data center, comprising following steps:

step S0: measuring, by a first sensor, a temperature at a return air position of a water-cooled precision air conditioner, and measuring, by a second sensor, a temperature at an air outlet position of the water-cooled precision air conditioner;

step S1: constructing an initial training dataset by using historical sampling data, defining a time interval between each two adjacent sampling time points as a sampling cycle, and defining a prediction cycle for each sampling cycle, wherein a length of the prediction cycle is a prediction depth of a temperature difference prediction model, and an initial time point of the prediction cycle is an initial time point of a same sampling cycle; the initial training dataset is constructed by taking heat source data of a cloud server and control quantity data of the water-cooled precision air conditioner at the initial time point of the prediction cycle as input data of the model, and taking a measured sensor temperature difference at an end time point of the same prediction cycle as output data of the model; the heat source data comprises performance data and temperature data of a component of the cloud server, the control quantity data comprises an opening degree of an electric water valve and an air conditioning frequency of the water-cooled precision air conditioner, wherein the electric water valve is disposed on a chilled water return pipe of the water-cooled precision air conditioner, and a sensor temperature difference is a difference between a temperature at the return air position of the water-cooled precision air conditioner and a temperature at the air outlet position of the water-cooled precision air conditioner; and the measured sensor temperature difference is a difference between the temperature measured at the return air position of the water-cooled precision air conditioner at the step S0 and received from the first sensor and the temperature measured at the air outlet position of the water-cooled precision air conditioner at the step S0 and received from the second sensor;

step S2: pre-processing the initial training dataset;

step S3: beginning training a Bayesian linear regression model based on the pre-processed initial training dataset to obtain an initial temperature difference prediction model;

step S4: obtaining a newly-added training dataset, wherein the newly-added training dataset comprises: heat source data of the cloud server at an initial time point of a prediction cycle predicted at the end of an initial time point of a current sampling cycle, control quantity data of the water-cooled precision air conditioner at the initial time point of the prediction cycle predicted at the end of the initial time point of the current sampling cycle, and a measured sensor temperature difference of a machine room at an end time point of the prediction cycle predicted at the end of the initial time point of the current sampling cycle;

step S5: pre-processing the newly-added training dataset;

step S6: incrementally training the Bayesian linear regression model online based on the pre-processed newly-added training dataset;

step S7: based on a current Bayesian linear regression model, by predicting a sensor temperature difference at an end time point of a prediction cycle defined for the current sampling cycle, finding an optimal combination of the opening degree of the electric water valve and the air conditioning frequency, and using and implementing the optimal combination, wherein the step S7 comprises: traversing predicted sensor temperature differences at the end time point of the prediction cycle defined for the current sampling cycle that are obtained by taking heat source data and each element in a gear combination set at the initial time point of the current sampling cycle as inputs of the current Bayesian linear regression model, and resetting the opening degree of the electric water valve and the air conditioning frequency in the current sampling cycle for the water-cooled precision air conditioner based on an element corresponding to a predicted sensor temperature difference less than and approximate to a target temperature difference threshold, wherein the gear combination set is a complete set of combinations obtained by pairing opening degrees of the electric water valve under different gears and air conditioning frequencies under the different gears;

step S8: determining whether the process is over; and if the process is over, terminating the process; or if the process is not over, performing the step S4 continuously for a next sampling cycle of the current sampling cycle; and step S9: control, by a control unit, an opening degree of the electric water valve of the water-cooled precision air conditioner and the air conditioning frequency of the water-cooled precision air conditioner based on the optimal combination of the opening degree of the electric water valve and the air conditioning frequency.

2. The data analysis-based energy-saving control method for the precision air conditioner in the cloud computing data center according to claim 1, wherein the performance data in the step S1 and the step S4 comprises any one or more kinds of following data:

a fan speed of each cloud server node in the machine room;

a frequency of a central processing unit (CPU) of each cloud server node in the machine room; and memory usage of each cloud server node in the machine room; and the temperature data comprises any one or more kinds of following data:

an inlet air temperature of each cloud server node in the machine room;

an outlet air temperature of each cloud server node in the machine room;

a temperature of the CPU of each cloud server node in the machine room; and a temperature of a graphics processing unit (GPU) of each cloud server node in the machine room.

3. The data analysis-based energy-saving control method for the precision air conditioner in] the cloud computing data center according to claim 1, wherein the step S2 and the step S5 further comprise following steps:

a data cleaning step: if an obtained value $$x_t''$$

of a sampling data item at a sampling time point t is a vacant value, filling the vacant value with a historical average value of the data item;

a normalization step: for each data item, denoting minimum and maximum values of the data item in the initial training dataset defined in the step S1 as $x_{min}$ and $x_{max}$ respectively, and mapping an original value $$x_t''$$

of the data item onto a new value $$x_t'$$

that is approximately in an interval [0,1], wherein a corresponding formula is:

$$x_t' = \frac{(x_t'' - x_{min})}{(x_{max} - x_{min})};$$

and a weight adjustment step: setting a relatively early training sample to have a low contribution to the Bayesian linear regression model, wherein a linear function corresponding to a contribution weight is:

$$w(t) = \alpha(t - t_0)$$

wherein w(t) represents a time-related contribution weight, a represents a parameter for adjusting a rate at which the contribution weight w(t) increases with time, t represents a current sampling time point, to represents a historical first sampling time point, and $\alpha \in (0, +\infty)$;

changing the value $$x_t'$$

of the data item to a new value $x_t$ through weight adjustment, wherein a corresponding formula is:

$$x_t = w(t)x_t'; \text{ and}$$

combining a processed value $x_t$ of each data item in the training sample into a pre-processed training sample as an input for initially training the Bayesian linear regression model in the step S3 and incrementally training the Bayesian linear regression model in the step S6.

4. The data analysis-based energy-saving control method for the precision air conditioner in the cloud computing data center according to claim 1, wherein the step S3 further comprises:

an initial learning step: in an initial training stage of the Bayesian linear regression model, setting a prior distribution of a model parameter to obey a Gaussian-anti-GAMMA probability distribution with given initial hyper-parameters being $\mu_0$, $\Lambda_0$, $a_0$, and $b_0$, and after the initial training is completed for the Bayesian linear regression model, setting a posteriori distribution of the model parameter to obey a Gaussian-anti-GAMMA probability distribution with hyper-parameters being $\mu_n$, $\Lambda_n$, $a_n$, and $b_n$, wherein n represents a last sampling cycle in the initial training dataset; and all the hyper-parameters $\mu_n$, $\Lambda_n$, $a_n$, and $b_n$ are simple functions of $\mu_0$, $\Lambda_0$, $a_0$, $b_0$, and an initial training sample set, and have analytical solutions; and the step S6 further comprises:

an incremental learning step: in an incremental training stage of the Bayesian linear regression model, setting a model parameter before a current sampling cycle t to obey a Gaussian-anti-GAMMA probability distribution with hyper-parameters being $\mu_{t-1}$, $\Lambda_{t-1}$, $a_{t-1}$, and $b_{t-1}$, and adding a sampling training sample for the current sampling cycle t in the current sampling cycle t to update the model parameter in the current sampling cycle t to obey a Gaussian-anti-GAMMA probability distribution with hyper-parameters being $\mu_t$, $\Lambda_t$, $a_t$, and $b_t$, wherein all the hyper-parameters $\mu_t$, $\Lambda_t$, $a_t$, and $b_t$ are simple functions of $\mu_{t-1}$, $\Lambda_{t-1}$, $a_{t-1}$, $b_{t-1}$, and an incremental training sample, and have analytical solutions.

5. The data analysis-based energy-saving control method for the precision air conditioner in the cloud computing data center according to claim 1, wherein initial time points of two consecutive adjacent prediction cycles are initial time points of two consecutive adjacent sampling cycles.

6. A data analysis-based refrigeration system for a cloud computing data center, comprising:

a machine room unit provided with a cloud server; and a refrigeration region disposed on one side of the machine room unit, wherein the refrigeration region is connected to the machine room unit through an air supply channel, cold air generated by the refrigeration region enters the machine room unit through the air supply channel, and the refrigeration region is provided with a water-cooled precision air conditioner refrigeration unit, wherein the water-cooled precision air conditioner refrigeration unit comprises:

a water-cooled precision air conditioner configured to cool air from the machine room unit;

an electric water valve disposed on a chilled water return pipe of the water-cooled precision air conditioner;

a first sensor disposed in the refrigeration region and located at a return air position of the water-cooled precision air conditioner, wherein the first sensor is electrically connected to a control unit, the first sensor is configured to collect a temperature of hot air entering the water-cooled precision air conditioner and send the collected temperature to the control unit, and the control unit defines the temperature sent by the first sensor as a temperature at the return air position; and a second sensor disposed within the air supply channel and located at a bottom of the water-cooled precision air conditioner, wherein the second sensor is electrically connected to the control unit, the second sensor is configured to collect a temperature of cold air output by the water-cooled precision air conditioner and send the collected temperature to the control unit, and the control unit defines the temperature sent by the second sensor as a temperature at an air outlet position; and the data analysis-based refrigeration system for a cloud computing data center further comprises:

the control unit, wherein the control unit is configured to perform steps S1-S9 of the method of claim 1, to control an opening degree of the electric water valve of the water-cooled precision air conditioner and an air conditioning frequency of the water-cooled precision air conditioner.

7. The data analysis-based refrigeration system for the cloud computing data center according to claim 6, wherein in the control unit, a program module in the computer-readable storage medium storing the computer program comprises:

a data collection module configured to collect heat source data of the cloud server, control quantity data of the water-cooled precision air conditioner, and a measured sensor temperature difference;

a data pre-processing module configured to pre-process the data collected by the data collection module;

a temperature difference prediction model training module configured to train a Bayesian linear regression model based on pre-processed data; and an optimal solution search module configured to find an optimal combination of the opening degree of the electric water valve and the air conditioning frequency based on the Bayesian linear regression model, and use and implement the optimal combination.

8. The data analysis-based a refrigeration system for the cloud computing data center according to claim 7, wherein in the control unit, the data collection module comprises:

an initial training dataset construction module configured to construct an initial training dataset by using historical sampling data, define a time interval between each two adjacent sampling time points as a sampling cycle, and define a prediction cycle for each sampling cycle, wherein a length of the prediction cycle is a prediction depth of a temperature difference prediction model, and an initial time point of the prediction cycle is an initial time point of a same sampling cycle; the initial training dataset is constructed by taking heat source data of the cloud server and control quantity data of the water-cooled precision air conditioner at the initial time point of the prediction cycle as input data of the model, and taking a measured sensor temperature difference at an end time point of the same prediction cycle as output data of the model; the heat source data comprises performance data and temperature data of a component of the cloud server, the control quantity data comprises the opening degree of the electric water valve and the air conditioning frequency, and a sensor temperature difference is a difference between the temperature at the return air position of the water-cooled precision air conditioner and the temperature at the outlet position of the water-cooled precision air conditioner; and the measured sensor temperature difference is a difference between a temperature measured at the return air position of the water-cooled precision air conditioner and a temperature measured at the air outlet position of the water-cooled precision air conditioner; and a newly-added training dataset construction module configured to obtain a newly-added training dataset, wherein the newly-added training dataset comprises: heat source data of the cloud server at an initial time point of a prediction cycle ending at an initial time point of a current sampling cycle, control quantity data of the water-cooled precision air conditioner at the initial time point of the prediction cycle ending at the initial time point of the current sampling cycle, and a measured sensor temperature difference of a machine room at an end time point of the prediction cycle ending at the initial time point of the current sampling cycle;

the data pre-processing module comprises:
an initial training dataset pre-processing module configured to pre-process the initial training dataset; and
a newly-added training dataset pre-processing module configured to pre-process the newly-added training dataset;

the temperature difference prediction model training module comprises:
an initial training dataset training module configured to initially train the Bayesian linear regression model based on pre-processed initial training data to obtain an initial temperature difference prediction model; and
a newly-added training dataset training module configured to incrementally train the Bayesian linear regression model online based on a pre-processed newly-added training dataset; and the optimal solution search module comprises:
a grid search module configured to, based on a current Bayesian linear regression model, by predicting a sensor temperature difference at an end time point of a prediction cycle defined for the current sampling cycle, find the optimal combination of the opening degree of the electric water valve and the air conditioning frequency, and use and implement the optimal combination, wherein the process specifically comprises: traversing predicted sensor temperature differences at the end time point of the prediction cycle defined for the current sampling cycle that are obtained by taking heat source data and each element in a gear combination set at the initial time point of the current sampling cycle as inputs of the current Bayesian linear regression model, and resetting the opening degree of the electric water valve and the air conditioning frequency in the current sampling cycle for the water-cooled precision air conditioner based on an element corresponding to a predicted sensor temperature difference less than and approximate to a target temperature difference threshold, wherein the gear combination set is a complete set of combinations obtained by pairing opening degrees of the electric water valve under different gears and air conditioning frequencies under the different gears; and a process termination determining module configured to determine whether the process is over; and if the process is over, terminates the process; or if the process is not over, triggers the newly-added training dataset construction module to continuously perform the corresponding operations for a next sampling cycle of the current sampling cycle.

9. The data analysis-based refrigeration system for the cloud computing data center according to claim 6, wherein the performance data in the step S1 and the step S4 comprises any one or more kinds of following data:
a fan speed of each cloud server node in the machine room;
a frequency of a central processing unit (CPU) of each cloud server node in the machine room; and
memory usage of each cloud server node in the machine room; and
the temperature data comprises any one or more kinds of following data:
an inlet air temperature of each cloud server node in the machine room;
an outlet air temperature of each cloud server node in the machine room;
a temperature of the CPU of each cloud server node in the machine room; and
a temperature of a graphics processing unit (GPU) of each cloud server node in the machine room.

10. The data analysis-based refrigeration system for the cloud computing data center according to claim 6, wherein the step S2 and the step S5 further comprise following steps:
a data cleaning step: if an obtained value $$x_t''$$

of a sampling data item at a sampling time point t is a vacant value, filling the vacant value with a historical average value of the data item;
a normalization step: for each data item, denoting minimum and maximum values of the data item in the initial training dataset defined in the step S1 as $x_{min}$ and $x_{max}$ respectively, and mapping an original value $$x_t'$$

of the data item onto a new value $$x_t'$$

that is approximately in an interval [0,1], wherein a corresponding formula is:

$$x_t' = \frac{(x_t'' - x_{min})}{(x_{max} - x_{min})};$$

and a weight adjustment step: setting a relatively early training sample to have a low contribution to the Bayesian linear regression model, wherein a linear function corresponding to a contribution weight is:

$$w(t) = \alpha(t - t_0) \qquad 5$$

wherein w(t) represents a time-related contribution weight, $\alpha$ represents a parameter for adjusting a rate at which the contribution weight w(t) increases with time, t represents a current sampling time point, t0 represents a historical first sampling time point, and $\alpha \in (0, +\infty)$; changing the value $$x_t' \qquad 15$$

of the data item to a new value $x_t$ through weight adjustment, wherein a corresponding formula is:

$$x_t = w(t)x_t'; \text{ and} \qquad 20$$

combining a processed value $x_t$ of each data item in the training sample into a pre-processed training sample as an input for initially training the Bayesian linear regression model in the step S3 and incrementally training the Bayesian linear regression model in the step S6.

11. The data analysis-based refrigeration system for the cloud computing data center according to claim 6, wherein the step S3 further comprises:

an initial learning step: in an initial training stage of the Bayesian linear regression model, setting a prior distribution of a model parameter to obey a Gaussian-anti-GAMMA probability distribution with given initial hyper-parameters being $\mu_0$, $\Lambda_0$, $a_0$, and $b_0$, and after the initial training is completed for the Bayesian linear regression model, setting a posteriori distribution of the model parameter to obey a Gaussian-anti-GAMMA probability distribution with hyper-parameters being $\mu_n$, $\Lambda_n$, $a_n$, and $b_n$, wherein n represents a last sampling cycle in the initial training dataset; and all the hyper-parameters $\mu_n$, $\Lambda_n$, $a_n$, and $b_n$ are simple functions of po, $\Lambda_0$, $a_0$, $b_0$, and an initial training sample set, and have analytical solutions; and the step S6 further comprises:

an incremental learning step: in an incremental training stage of the Bayesian linear regression model, setting a model parameter before a current sampling cycle t to obey a Gaussian-anti-GAMMA probability distribution with hyper-parameters being $\mu_{t-1}$, $\Lambda_{t-1}$, $a_{t-1}$, and $b_{t-1}$, and adding a sampling training sample for the current sampling cycle t in the current sampling cycle t to update the model parameter in the current sampling cycle t to obey a Gaussian-anti-GAMMA probability distribution with hyper-parameters being $\mu_t$, $\Lambda_t$, $a_t$, and $b_t$, wherein all the hyper-parameters $\mu_t$, $\Lambda_t$, $a_t$, and $b_t$ are simple functions of $\mu_{t-1}$, $\Lambda_{t-1}$, $a_{t-1}$, $b_{t-1}$, and an incremental training sample, and have analytical solutions.

12. The data analysis-based refrigeration system for the cloud computing data center according to claim 6, wherein initial time points of two consecutive adjacent prediction cycles are initial time points of two consecutive adjacent sampling cycles.

* * * * *